United States Patent
Asami

(10) Patent No.: US 8,698,220 B2
(45) Date of Patent: Apr. 15, 2014

(54) SEMICONDUCTOR DEVICE HAVING CONCENTRATION DIFFERENCE OF IMPURITY ELEMENT IN SEMICONDUCTOR FILMS

(75) Inventor: Yoshinobu Asami, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 161 days.

(21) Appl. No.: 13/186,041

(22) Filed: Jul. 19, 2011

(65) Prior Publication Data

US 2011/0272752 A1 Nov. 10, 2011

Related U.S. Application Data

(62) Division of application No. 12/026,676, filed on Feb. 6, 2008, now Pat. No. 7,994,000.

(30) Foreign Application Priority Data

Feb. 27, 2007 (JP) ................................ 2007-046807

(51) Int. Cl.
*H01L 27/13* (2006.01)

(52) U.S. Cl.
USPC ............. 257/298; 257/E29.275; 257/E27.016

(58) Field of Classification Search
None
See application file for complete search history.

(56) References Cited

U.S. PATENT DOCUMENTS

| | | | |
|---|---|---|---|
| 6,410,412 B1 | 6/2002 | Taira et al. | |
| 6,498,369 B1 | 12/2002 | Yamazaki et al. | |
| 6,590,229 B1 | 7/2003 | Yamazaki et al. | |
| 6,639,244 B1 * | 10/2003 | Yamazaki et al. | ............... 257/72 |
| 6,646,288 B2 | 11/2003 | Yamazaki et al. | |
| 6,890,784 B2 | 5/2005 | Yamazaki et al. | |
| 7,151,015 B2 | 12/2006 | Suzawa et al. | |
| 7,161,177 B2 | 1/2007 | Suzawa et al. | |
| 7,208,766 B2 | 4/2007 | Yamazaki et al. | |
| 7,414,267 B2 | 8/2008 | Yamazaki et al. | |
| 7,727,836 B2 | 6/2010 | Yamazaki et al. | |
| 2005/0263767 A1 * | 12/2005 | Yamazaki et al. | ............... 257/72 |
| 2006/0267141 A1 | 11/2006 | Saito | |
| 2007/0111424 A1 | 5/2007 | Suzawa et al. | |
| 2007/0228449 A1 | 10/2007 | Takano et al. | |
| 2007/0228452 A1 | 10/2007 | Asami | |
| 2008/0093454 A1 * | 4/2008 | Yamazaki et al. | ............ 235/454 |

FOREIGN PATENT DOCUMENTS

| | | |
|---|---|---|
| EP | 1 045 447 A2 | 10/2000 |
| EP | 1022786 A | 10/2010 |
| JP | 2000-269512 | 9/2000 |
| JP | 2000-356788 | 12/2000 |
| JP | 2001-326289 | 11/2001 |
| JP | 2002-050636 | 2/2002 |
| JP | 2006-041265 | 2/2006 |
| KR | 2005-0013175 A | 2/2005 |

* cited by examiner

*Primary Examiner* — Wensing Kuo
(74) *Attorney, Agent, or Firm* — Nixon Peabody LLP; Jeffrey L. Costellia

(57) ABSTRACT

To provide a semiconductor device having a memory element, and which is manufactured by a simplified manufacturing process. A method of manufacturing a semiconductor device includes, forming a first insulating film to cover a first semiconductor film and a second semiconductor film; forming a first conductive film and a second conductive film over the first semiconductor film and the second semiconductor film, respectively, with the first insulating film interposed therebetween; forming a second insulating film to cover the first conductive film; forming a third conductive film selectively over the first conductive film which is formed over the first semiconductor film, with the second insulating film interposed therebetween, and doping the first semiconductor film with an impurity element with the third conductive film serving as a mask and doping the second semiconductor film with the impurity element through the second conductive film.

6 Claims, 12 Drawing Sheets

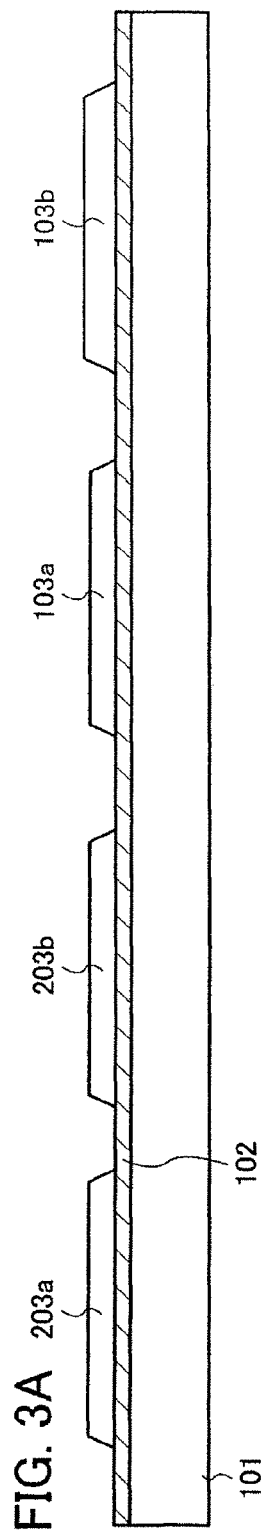
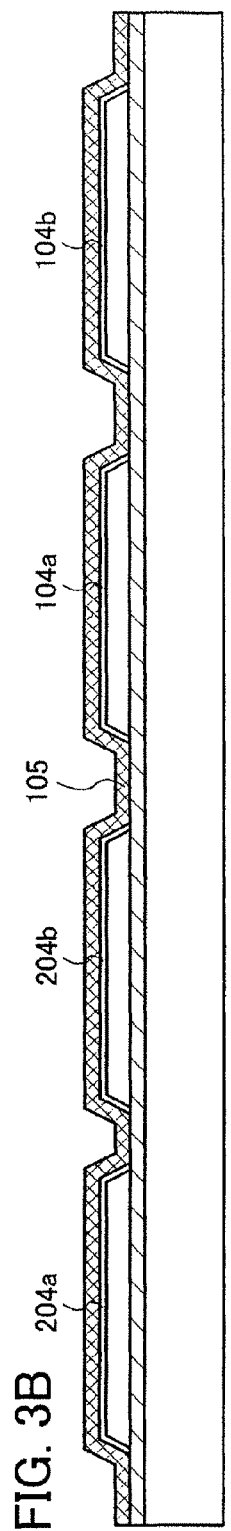
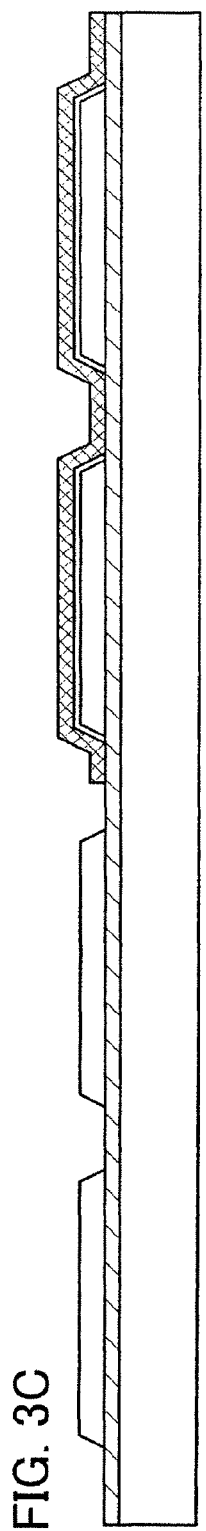
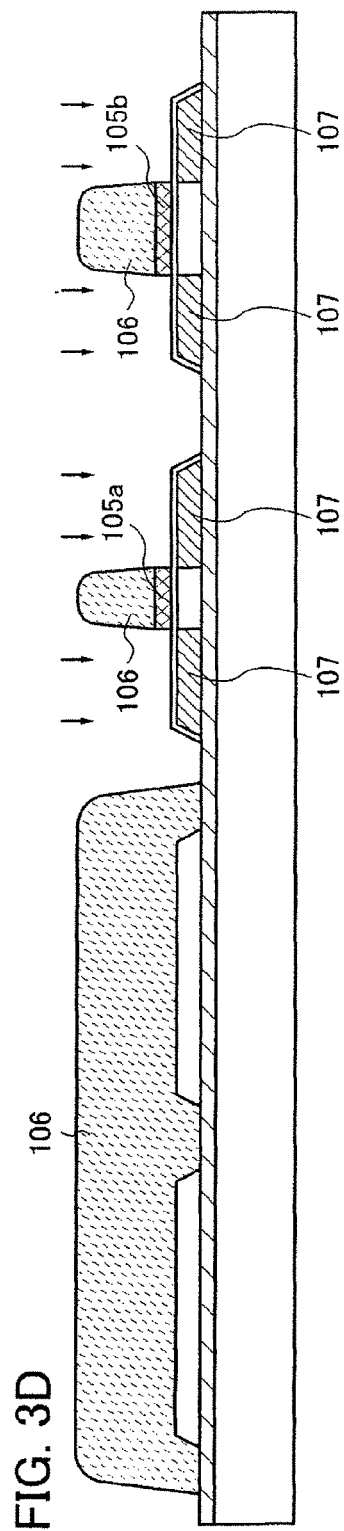

307

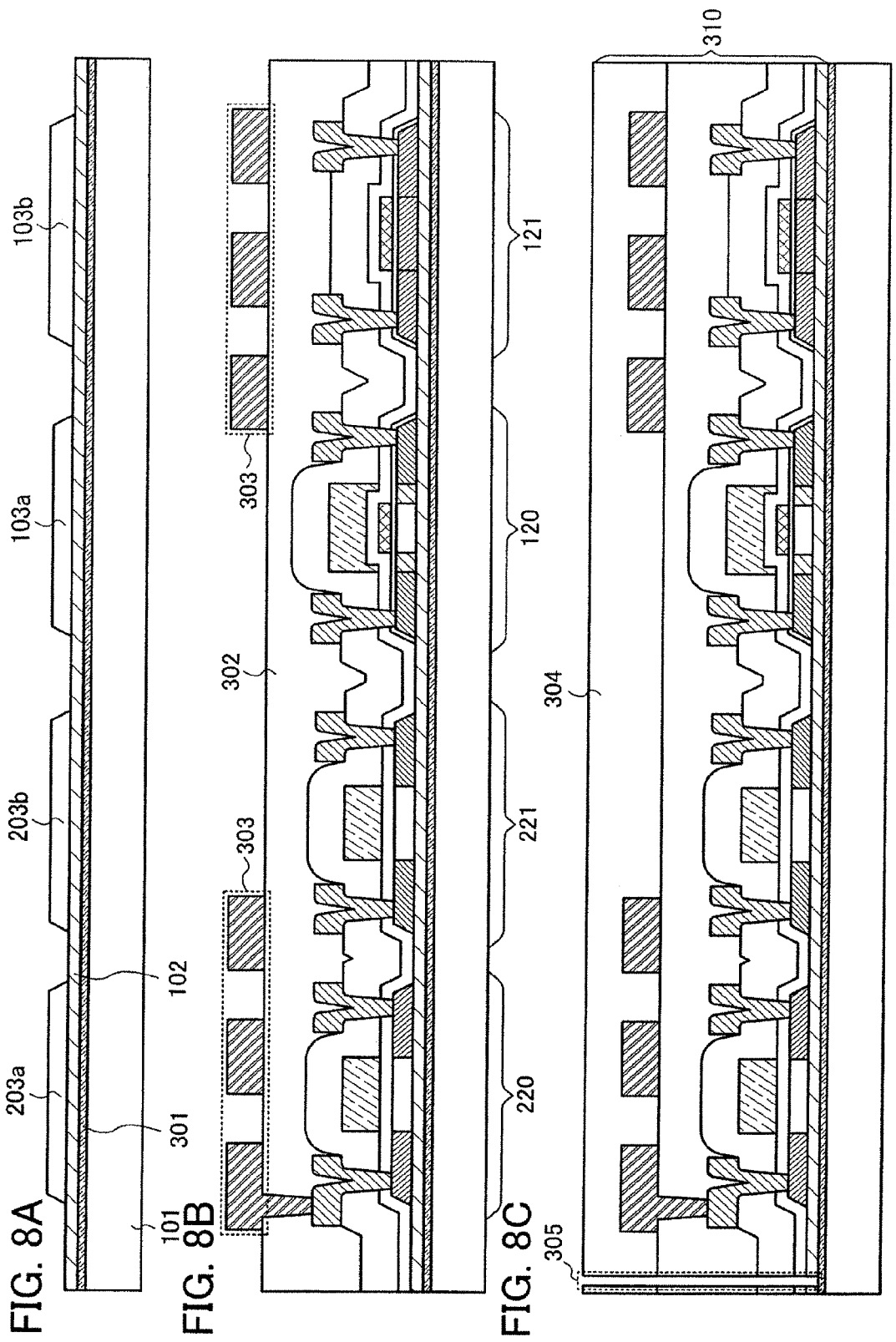

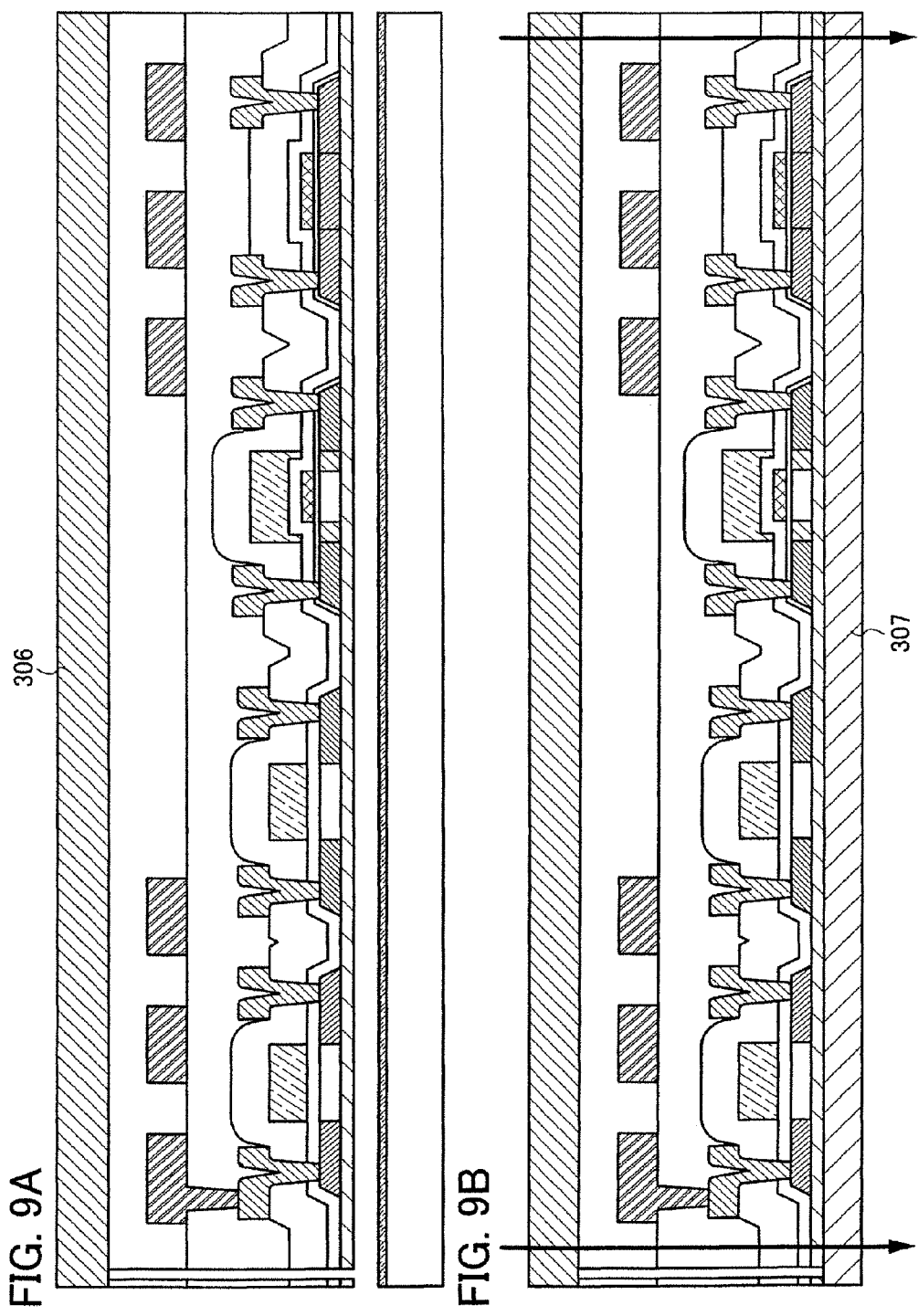

a semiconductor device 80

SEMICONDUCTOR DEVICE HAVING CONCENTRATION DIFFERENCE OF IMPURITY ELEMENT IN SEMICONDUCTOR FILMS

BACKGROUND OF THE INVENTION

1. Field of the Invention

The present invention relates to semiconductor devices and methods of manufacturing the semiconductor devices. In particular, the present invention relates to semiconductor devices including memory elements and methods of manufacturing the semiconductor devices including memory elements.

2. Description of the Related Art

In recent years, semiconductor devices have been improved significantly. As integration and density of semiconductor devices become higher, miniaturization of various element patterns therein such as transistors or capacitors has been rapidly progressed. There are strong demands for semiconductor devices which are small in size and large in capacity and can be manufactured at low cost. To fulfill such demands, it is essential to further miniaturize various element patterns. As well as reduction in size of transistors, memory elements, capacitors, and the like for reducing an area occupied by such elements, manufacture of such elements at low cost are necessary. Development of structures of such elements has been actively conducted to meet the need.

For example, in Patent Document 1 (Japanese Published Patent Application No. 2000-269512), in a pixel matrix circuit including thin film transistors, a capacitor (a transistor-type capacitor) has one electrode of a semiconductor film which is doped with an impurity element, the other electrode of a conductive film which corresponds to a gate electrode of a transistor, and an insulating film between the two electrodes which corresponds to a gate insulating film of the transistor, so that capacitance per unit area is increased. Therefore, an area occupied by elements is reduced in the device of Patent Document 1.

SUMMARY OF THE INVENTION

In a case where a capacitor has one electrode of a semiconductor film which is doped with an impurity element and the other electrode of a conductive film corresponding to a gate electrode of a transistor, the following steps are required: forming a semiconductor film over a substrate, doping a part of the semiconductor film which is included in the capacitor with an impurity element at high concentration; and then, forming a gate electrode. This is because a part of the semiconductor film which is included in the transistor is to be doped with an impurity element at high concentration in a self-alignment manner with the gate electrode serving as a mask. Therefore, there arise problems of increase in cost due to increase in the number of manufacturing steps and contamination to the part of the semiconductor film which is not subjected to the doping with the impurity element at high concentration before the formation of the gate electrode.

To avoid such problems, a semiconductor film which is not doped with an impurity element may be used as one electrode of a transistor-type capacitor; however, if voltage applied to the other electrode of the transistor-type capacitor is lower than a threshold voltage of the transistor-type capacitor, the transistor-type capacitor may fail to function as a capacitor.

With view of the foregoing problems, it is an object of the present invention to provide a method with a simplified manufacturing process for a semiconductor device. In addition, it is an object of the present invention to provide a semiconductor device including a memory element, in which an area of a capacitor is reduced.

The present invention relates to a method of manufacturing a semiconductor device including a capacitor in which an insulating film is interposed between two electrodes. In the capacitor, a semiconductor film serving as one of the electrodes is doped with an impurity element through the insulating film and a conductive film serving as the other electrode. In addition, the semiconductor film serving as the one of the electrodes is formed at the same time as a semiconductor film which is included in a memory element formed over the same substrate as the capacitor, and the conductive film serving as the other electrode of the capacitor is formed at the same time as a conductive film (also referred to as a charge storage layer or a floating gate) which is included in the memory element. Hereinafter, a semiconductor device of the present invention and a method of manufacturing the semiconductor device are described in detail.

A method of manufacturing a semiconductor device, according to one aspect of the present invention, includes forming a first semiconductor film and a second semiconductor film over a substrate; forming a first insulating film to cover the first semiconductor film and the second semiconductor film; forming a first conductive film and a second conductive film over the first semiconductor film and the second semiconductor film, respectively, with the first insulating film interposed therebetween; forming a second insulating film to cover the first conductive film; forming a third conductive film selectively over the first conductive film which is formed over the first semiconductor film, with the second insulating film interposed between the first conductive film and the third conductive film; and doping the first semiconductor film with an impurity element with the third conductive film serving as a mask and doping the second semiconductor film with the impurity element through the second conductive film.

A method of manufacturing a semiconductor device, according to another aspect of the present invention, includes forming a first semiconductor film, a second semiconductor film, and a third semiconductor film over a substrate; forming a first insulating film to cover the first semiconductor film, the second semiconductor film, and the third semiconductor film; forming a first conductive film and a second conductive film selectively over the first semiconductor film and the second semiconductor film, respectively, with the first insulating film interposed therebetween; removing the first insulating film which is formed over the third semiconductor film; forming a second insulating film to cover the first conductive film, the second conductive film, and the third semiconductor film; forming a third conductive film selectively over the first conductive film which is formed over the first semiconductor film, with the second insulating film interposed between the first conductive film and the third conductive film; forming a fourth conductive film selectively over the third semiconductor film with the second insulating film interposed therebetween; and doping the first semiconductor film with an impurity element with the third conductive film serving as a mask, doping the third semiconductor film with the impurity element with the fourth conductive film serving as a mask, and doping the second semiconductor film with the impurity element through the second conductive film.

A method of manufacturing a semiconductor device, according to another aspect of the present invention, includes forming a first semiconductor film, a second semiconductor film, and a third semiconductor film over a substrate; forming a first insulating film to cover the first semiconductor film, the second semiconductor film, and the third semiconductor film; forming a first conductive film and a second conductive film selectively over the first semiconductor film and the second semiconductor film, respectively, with the first insulating film interposed therebetween; removing the first insulating film which is formed over the third semiconductor film; forming a second insulating film to cover the first conductive film, the second conductive film, and the third semiconductor film; forming a third conductive film selectively over the first conductive film which is formed over the first semiconductor film, with the second insulating film interposed between the first conductive film and the third conductive film; forming a fourth conductive film selectively over the third semiconductor film with the second insulating film interposed therebetween; doping the first semiconductor film with an impurity element with the third conductive film serving as a mask, doping the third semiconductor film with the impurity element with the fourth conductive film serving as a mask, and doping the second semiconductor film with the impurity element through the second conductive film; forming a third insulating film to cover the third conductive film, the fourth conductive film, and the second insulating film; and forming a conductive film serving as an antenna over the third insulating film.

A semiconductor device according to another aspect of the present invention includes a substrate; a first semiconductor film and a second semiconductor film which have island-shaped and formed over the substrate; a first insulating film formed over the first semiconductor film and the second semiconductor film; a first conductive film and a second conductive film which are formed over the first semiconductor film and the second semiconductor film, respectively, with the first insulating film interposed therebetween; a second insulating film formed over the first conductive film and the second conductive film; and a third conductive film formed over the first conductive film with the second insulating film interposed therebetween. In the semiconductor device, the first semiconductor film, the first insulating film, the first conductive film, the second insulating film, and the third conductive film are stacked to form a nonvolatile memory element; the second semiconductor film, the first insulating film, and the second conductive film are stacked to form a capacitor; and a concentration of an impurity element contained in a region of the second semiconductor film which is under the second conductive film is higher than a concentration of an impurity element contained in a region of the first semiconductor film which is under the first conductive film.

A semiconductor device according to another aspect of the present invention includes a substrate; a first semiconductor film, a second semiconductor film, and a third semiconductor film which are island-shaped and formed over the substrate; a first insulating film formed over the first semiconductor film and the second semiconductor film; a first conductive film and a second conductive film which are formed over the first semiconductor film and the second semiconductor film, respectively, with the first insulating film interposed therebetween; a second insulating film formed over the first conductive film, the second conductive film, and the third semiconductor film; a third conductive film formed over the first conductive film with the second insulating film interposed therebetween; and a fourth conductive film formed over the third semiconductor film with the second insulating film interposed therebetween. In the semiconductor device, the first semiconductor film, the first insulating film, the first conductive film, the second insulating film, and the third conductive film are stacked to form a nonvolatile memory element; the second semiconductor film, the first insulating film, and the second conductive film are stacked to form a capacitor; the third semiconductor film, the second insulating film, and the fourth conductive film are stacked to form a thin film transistor; and a concentration of an impurity element contained in a region of the second semiconductor film which is under the second conductive film is higher than a concentration of an impurity element contained in a region of the first semiconductor film which is under the first conductive film, and is higher than a concentration of an impurity element contained in a region of the third semiconductor film which is under the fourth conductive film.

A semiconductor device according to another aspect of the present invention includes a substrate; a first semiconductor film, a second semiconductor film, and a third semiconductor film which are island-shaped and formed over the substrate; a first insulating film formed over the first semiconductor film and the second semiconductor film; a first conductive film and a second conductive film which are formed over the first semiconductor film and the second semiconductor film, respectively, with the first insulating film interposed therebetween; a second insulating film formed over the first conductive film, the second conductive film, and the third semiconductor film; a third conductive film formed over the first conductive film with the second insulating film interposed therebetween; a fourth conductive film formed over the third semiconductor film with the second insulating film interposed therebetween; a third insulating film formed to cover the third conductive film, the fourth conductive film, and the second insulating film; and a conductive film serving as an antenna which is formed over the third insulating film. In the semiconductor device, the first semiconductor film, the first insulating film, the first conductive film, the second insulating film, and the third conductive film are stacked to form a nonvolatile memory element; the second semiconductor film, the first insulating film, and the second conductive film are stacked to form a capacitor; the third semiconductor film, the second insulating film, and the fourth conductive film are stacked to form a thin film transistor; and a concentration of an impurity element contained in a region of the second semiconductor film which is under the second conductive film is higher than a concentration of an impurity element contained in a region of the first semiconductor film which is under the first conductive film, and is higher than a concentration of an impurity element contained in a region of the third semiconductor film which is under the fourth conductive film.

According to the present invention, manufacturing steps and cost can be reduced because, in doping a semiconductor film which is included in a transistor or a memory element with an impurity element, a semiconductor film which serves as one electrode of a capacitor is also doped with the impurity element through the other electrode of the capacitor. Further, capacitance per unit area is increased and an area of an element can be reduced by manufacturing an insulating film included in the capacitor to have approximately the same thickness as an insulating film which can serve as a tunnel insulating film of the memory element.

BRIEF DESCRIPTION OF THE DRAWINGS

FIGS. 3A to 3D are diagrams showing an example of a method of manufacturing a semiconductor device of the present invention;

FIGS. 8A to 8C are diagrams showing an example of a method of manufacturing a semiconductor device of the present invention;

FIGS. 9A and 9B are diagrams showing an example of a method of manufacturing a semiconductor device of the present invention;

DETAILED DESCRIPTION OF THE INVENTION

Figure 1A:
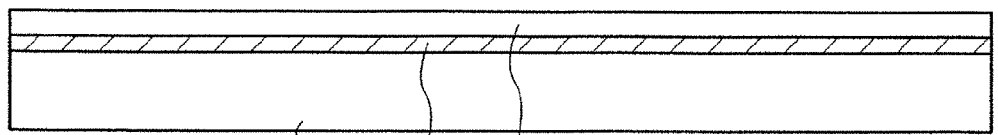
FIGS. 1A to 1F are diagrams showing an example of a method of manufacturing a semiconductor device of the present invention.
Figure 1B:
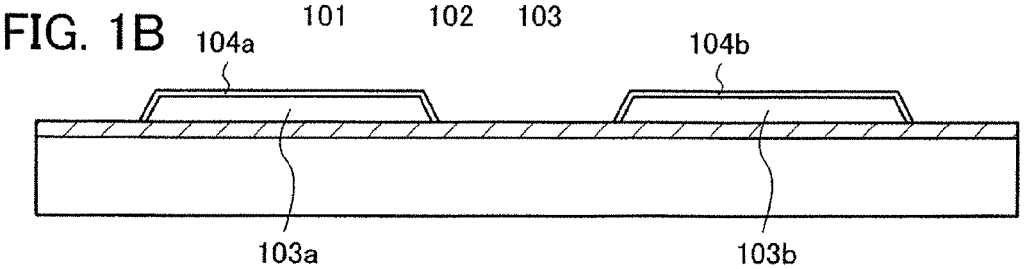

Hereinafter, embodiment modes of the present invention are described with reference to the drawings. Note that the present invention can be carried out in many different modes, and it will be readily appreciated by those skilled in the art that modes and details can be modified in various ways without departing from the sprit and scope of the present invention. Accordingly, the present invention should not be construed as being limited to the description of the embodiment modes. Note that in the drawings for illustrating the embodiment modes, common portions or potions having similar functions hold the same reference numerals and repeated description there of is omitted.

Embodiment Mode 1

In this embodiment mode, a method of manufacturing a semiconductor device of the present invention and a structure of the semiconductor device obtained by the manufacturing method are described with reference to the drawings.

A method of manufacturing a semiconductor device in this embodiment mode is described with reference to FIGS. 1A to 2D.

First, an insulating film 102 is formed on the substrate 101 and an amorphous semiconductor film 103 (e.g., a film containing amorphous silicon) is formed over the insulating film 102 (see FIG. 1A). The insulating film 102 and the amorphous semiconductor film 103 can be formed successively in a vacuum. When the insulating film 102 and the amorphous semiconductor film 103 are formed successively, they are not exposed to atmosphere, so that contamination by impurity elements can be prevented.

As the substrate 101, a glass substrate, a quartz substrate, a metal substrate, a stainless steel substrate, a plastic substrate which can withstand the treatment temperature of the process described here, or the like can be used. When such a substrate is used, the area and the shape thereof are not particularly limited. For example, when a rectangular substrate having one meter or longer on one side is used, productivity can be drastically improved. This is a great advantage over the case of using a circular silicon substrate and even in the case of forming a large integrated circuit portion, the cost can be low compared to the case of using a silicon substrate.

The insulating film 102 is a single layer or stacked-layers which includes a film containing oxide of silicon or nitride of silicon (e.g., a silicon oxide ($SiO_x$) film, a silicon oxynitride ($SiO_xN_y$) (where x>y) film, a silicon nitride ($SiN_x$) film, or a silicon nitride oxide ($SiN_xO_y$) (where x>y) film) formed by a sputtering method, a plasma CVD method, or the like. When the insulating film which serves as a base has a two-layer structure, a silicon nitride oxide film and a silicon oxynitride film may be formed as a first layer and a second layer, respectively. When the insulating film which serves as a base has a three-layer structure, a silicon oxide film, a silicon nitride oxide film, and a silicon oxynitride film may be formed as a first layer, a second layer, and a third layer, respectively. Alternatively, a silicon oxynitride film, a silicon nitride oxide film, and a silicon oxynitride film may be formed as a first layer, a second layer, and a third layer, respectively. The insulating film which serves as a base functions as a blocking film which prevents an impurity from the substrate 101.

The semiconductor film 103 is formed to have a thickness of 25 to 200 nm (preferably, 30 to 150 nm) by a sputtering method, an LPCVD method, a plasma CVD method, or the like. As the semiconductor film 103, an amorphous silicon film is formed hereinafter.

Then, the amorphous semiconductor film 103 is crystallized by laser light irradiation. Note that the amorphous semiconductor film 103 may be crystallized by a method in which laser light irradiation is combined with a thermal crystallization method using an RTA or an annealing furnace or thermal crystallization using a metal element which promotes crystallization. Then, thus obtained crystalline semiconductor film is etched into desired shapes to form crystalline semiconductor films 103a and 103b. Insulating films 104a and 104b are formed to cover the crystalline semiconductor films 103a and 103b, respectively (see FIG. 1B).

An example of a manufacturing process of the crystalline semiconductor films 103a and 103b is briefly explained below. First, the amorphous semiconductor film 103 (e.g., an amorphous silicon film) is formed by a plasma CVD method to have a thickness of 50 to 60 nm. Then, the amorphous semiconductor film is doped with nickel, which is a metal element for promoting crystallization, and dehydrogenation treatment (at 500° C., for one hour) and thermal crystallization treatment (at 550° C., for four hours) are performed, thus, a crystalline semiconductor film is formed. After that, the crystalline semiconductor film is irradiated with laser light from a laser and is processed using a photolithography method to form the crystalline semiconductor films 103a and 103b. Note that the amorphous semiconductor film may be crystallized only by laser light irradiation without thermal crystallization using a metal element for promoting crystallization.

Each of the insulating films 104a and 104b is a single layer or stacked-layers which includes a film containing oxide of silicon or nitride of silicon formed by a CVD method, a sputtering method, or the like. In specific, a single layer or stacked-layers which includes any of a silicon oxide film, a silicon oxynitride film, a silicon nitride film, and a silicon nitride oxide film are formed.

Alternatively, the insulating films 104a and 104b may be formed by oxidizing or nitriding the surfaces of the crystalline semiconductor films 103a and 103b by performing a plasma treatment. For example, the insulating films 104a and 104b are formed by performing a plasma treatment in which a mixed gas containing a rare gas such as He, Ar, Kr, or Xe and oxygen, nitrogen oxide, ammonia, nitrogen, or hydrogen is added. When excitation of the plasma is conducted by introduction of a microwave, plasma with a low electron temperature and a high density can be generated. Surfaces of the semiconductor films can be oxidized or nitrided by oxygen radicals (which may include OH radicals) or nitrogen radicals (which may include NH radicals) generated by such high-density plasma.

By the treatment using such high-density plasma, an insulating film is formed over the crystalline semiconductor film to have a thickness of 1 to 20 nm, typically 5 to 10 nm. Since the reaction in this case is a solid-phase reaction, the interface state density between the insulating film and the crystalline semiconductor film can be quite low. Since such high-density plasma treatment directly oxidizes (or nitrides) a semiconductor film (crystalline silicon or polycrystalline silicon), variation in thickness of the formed insulating film can be quite small. Further, crystal grain boundaries of crystalline silicon are not excessively oxidized, which makes a very favorable condition. In other words, by solid-phase oxidation of a surface of the crystalline semiconductor film by the high-density plasma treatment described here, an insulating film with good uniformity and low interface state density can be formed without excessive oxidation reaction at crystal grain boundaries.

As the insulating films 104a and 104b, an insulating film formed by high-density plasma treatment may only be used, or an insulating film of silicon oxide, silicon oxynitride, silicon nitride, or the like may be additionally deposited by a CVD method utilizing a plasma or thermal reaction and may be stacked. In any case, transistors including insulating films which are formed by high-density plasma as a part of gate insulating films or as the gate insulating films can have little variation in characteristics.

Figure 1C:
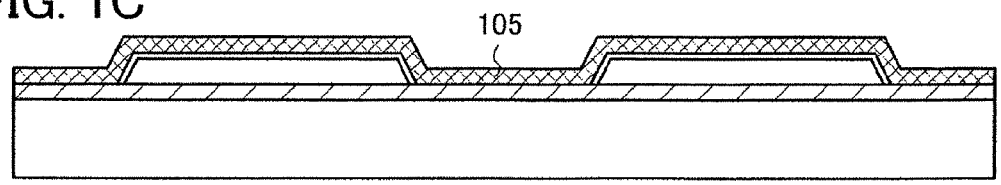
Figure 1D:
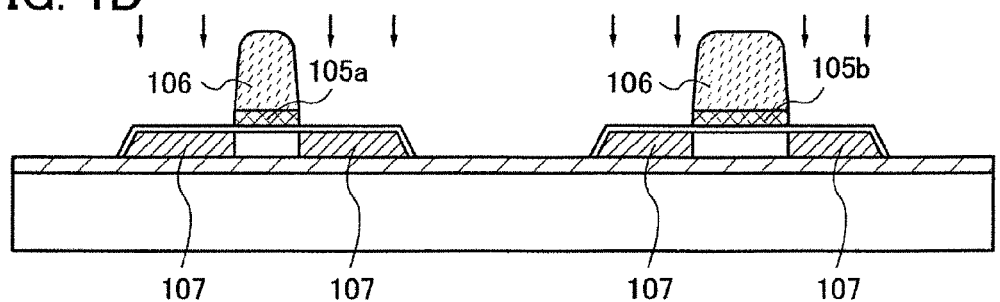

Then, a conductive film 105 is formed over the insulating films 104a and 104b (see FIG. 1C). The conductive film 105 can be, for example, a film including an element selected from tungsten (W), tantalum (Ta), titanium (Ti), molybdenum (Mo), chromium (Cr), and silicon (Si); a film including nitride of such an element (typically, a tungsten nitride film, a tantalum nitride film, or a titanium nitride film); an alloy film in which such elements are combined (typically, a Mo—W alloy or a Mo—Ta alloy); or a silicide film of such an element (typically, a tungsten silicide film, a titanium silicide film, or a nickel silicide film) can be used. An impurity such as phosphorus or boron may be added to a silicon film. The conductive layer may be a single layer or a stacked-layer including two or three layers. The conductive layer is formed by a sputtering method or a CVD method.

Then, a resist 106 is formed selectively over the conductive film 105. The conductive film 105 is selectively etched with the resist 106 serving as a mask so that a conductive film 105a and a conductive film 105b are left over the crystalline semiconductor film 103a and the crystalline semiconductor film 103b, respectively. Then, the crystalline semiconductor films 103a and 103b is doped an impurity element with the resist 106 serving as a mask to form impurity regions 107 in the crystalline semiconductor films 103a and 103b (see FIG. 1D).

An impurity element which is used for the doping is either an n-type impurity element or a p-type impurity element. As an n-type impurity element, phosphorus (P), arsenic (As), or the like can be used. As a p-type impurity element, boron (B), aluminium (Al), gallium (Ga), or the like can be used. Here, the case where the crystalline semiconductor films 103a and 103b is doped with phosphorus (P) to form the impurity regions 107 which are n-type impurity regions is described.

The conductive film 105a serves as a floating gate in a memory element which is formed later, while the conductive film 105b serves as an electrode in a capacitor which is formed later.

Figure 1E:
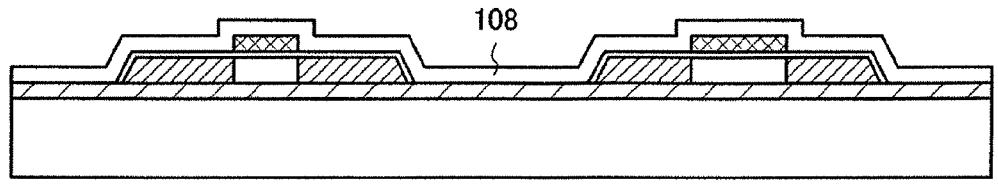

Then, after the resist 106 is removed, an insulating film 108 is formed to cover the conductive films 105a and 105b (see FIG. 1E). The insulating film 108 is a single layer or stacked-layers including a film which includes oxide of silicon or nitride of silicon (e.g., a silicon oxide film, a silicon oxynitride film, a silicon nitride film, or a silicon nitride oxide film) formed by a sputtering method, a plasma CVD method, or the like. For example, the insulating film 108 can have a structure in which a silicon oxynitride film, a silicon nitride film, and a silicon oxynitride film are stacked in that order.

Figure 1F:
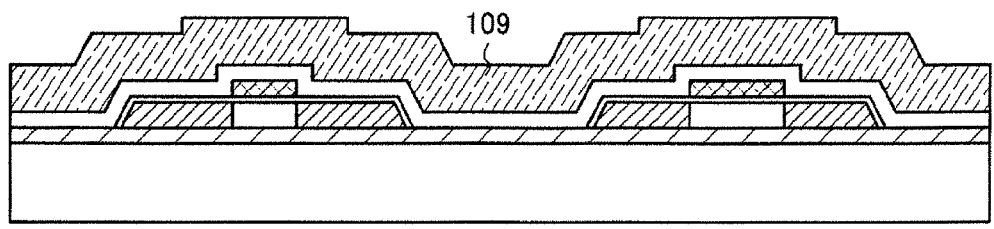

Then, a conductive film 109 is formed over the insulating film 108 (see FIG. 1F).

The conductive film 109 can be, for example, a film including an element selected from tantalum (Ta), tungsten (W), titanium (Ti), molybdenum (Mo), aluminium (Al), copper (Cu), chromium (Cr), and niobium (Nb); a film including nitride of such an element (typically, a tantalum nitride film, a tungsten nitride film, or a titanium nitride film); an alloy film in which such elements are combined (typically, a Mo—W alloy or a Mo—Ta alloy); or a silicide film of such an element (typically, a tungsten silicide film, a titanium silicide film, or a nickel silicide film) can be used. The conductive film 109 may have a structure in which a plurality of conductive films are stacked. For example, a structure may be employed in which a tantalum nitride film having a thickness of 20 nm to 100 nm and a tungsten film having a thickness of 100 nm to 400 nm are stacked in this order. Since tungsten and tantalum nitride have high thermal resistance, thermal treatment for thermal activation can be performed after the conductive film is formed.

Then, a resist 110 is formed selectively over the conductive film 109. The conductive film 109 is selectively etched with the resist 110 serving as a mask to leave a conductive film 109a over the crystalline semiconductor film 103a (see FIG. 2A). The conductive film 109 formed over the crystalline semiconductor film 103b is removed.

Figure 2A:
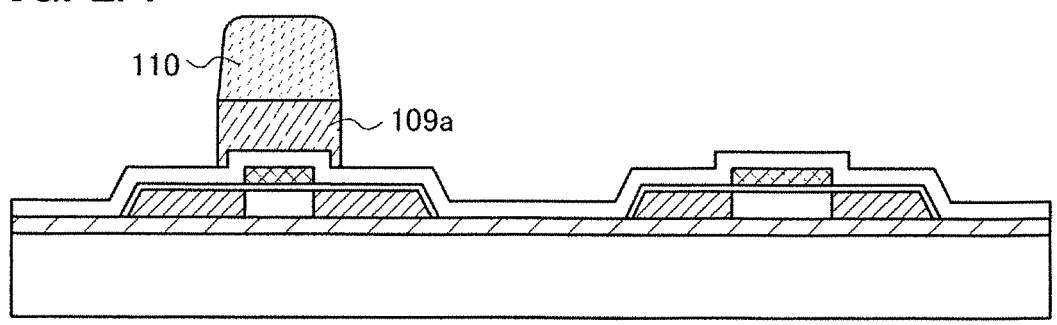
FIGS. 2A to 2D are diagrams showing an example of a method of manufacturing a semiconductor device of the present invention.
Figure 2B:
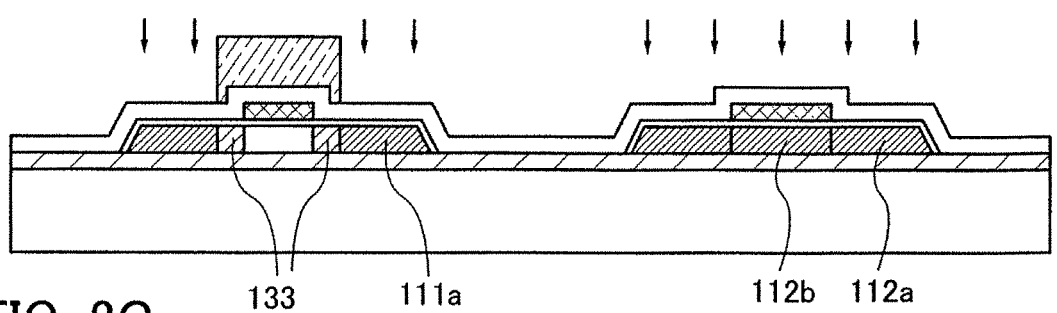

Then, after the resist 110 is removed, the crystalline semiconductor films 103a and 103b are doped with an impurity element with the conductive film 109a serving as a mask (see FIG. 2B). A part of the crystalline semiconductor film 103a which does not overlap with the conductive film 109a is doped with the impurity element to form impurity regions 111a. Note that LDD regions 133 which include low-concentrated impurity element are also formed. The entire part of the crystalline semiconductor film 103b is doped with the impurity element through the conductive film 105b to form impurity regions 112a and an impurity region 112b which overlaps with the conductive film 105b. Note that a part of the crystalline semiconductor film 103a which is under the conductive film 105a is not doped with an impurity element. Accordingly, a concentration of an impurity element which is contained in a region of the crystalline semiconductor film 103b which is under the conductive film 105b is higher than a concentration of an impurity element which is contained in a region of the crystalline semiconductor film 103a which is under the conductive film 105a.

An impurity element which is used for the doping is either an n-type impurity element or a p-type impurity element. As an n-type impurity element, phosphorus (P), arsenic (As), or the like can be used. As a p-type impurity element, boron (B), aluminium (Al), gallium (Ga), or the like can be used. Here, the case where the crystalline semiconductor films 103a and 103b are doped with phosphorus (P) at high concentration to form the impurity regions 111a, 112a, and 112b which are n-type impurity regions is described. In addition, a concentration of the impurity element in the impurity regions 111a, 112a, and 112b is higher than a concentration of the impurity element in the impurity region 107s formed in FIG. 1D. Needless to say, the crystalline semiconductor films may be doped with boron (B) to form p-type impurity regions.

Note that when the crystalline semiconductor film 103b is doped with an impurity element through the conductive film 105b, it is desirable that the insulating film 104b, the conductive film 105b, and the insulating film 108, which are formed over the crystalline semiconductor film 103b, are thin films and that the impurity element is added at a highly accelerated speed. In specific, the insulating film 104b having a thickness of 5 nm to 15 nm, the conductive film 105b having a thickness of 10 nm to 50 nm, and the insulating film 108 having a thickness of 20 nm to 60 nm are formed and the impurity element is added by a doping method at an accelerating voltage of 30 kV to 80 kV. Preferably, the insulating film 104b having a thickness of 8 nm to 10 nm, the conductive film 105b having a thickness of 20 nm to 40 nm, and the insulating film 108 having a thickness of 30 nm to 40 nm are formed and an impurity element is added by a doping method at an accelerating voltage of 40 kV to 50 kV. If an accelerating voltage is too high, the insulating film 104b may be damaged. When the foregoing condition is employed, the part of the semiconductor film 103b which overlaps with the conductive film 105b can be doped with an impurity element while damage on the insulating film 104b is reduced.

As in the above-described manner, in a process of forming an impurity region which can serve as a source region or a drain region in a semiconductor film which is included in a transistor-type memory element, a semiconductor film which is included in a capacitor is also doped with the impurity element; thus, reduction in the number of manufacturing steps and reduction in cost can be achieved.

Figure 2C:
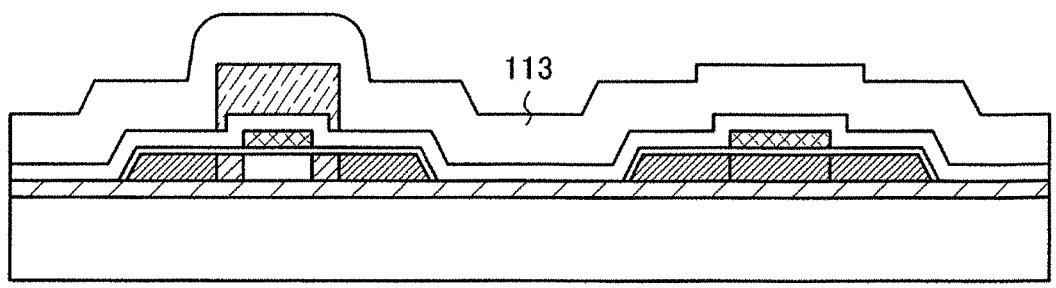

Then, an insulating film 113 is formed to cover the conductive film 109a and the insulating film 108 (see FIG. 2C). The insulating film 113 is a single layer or stacked-layers of inorganic material such as oxide of silicon or nitride of silicon; an organic material such as polyimide, polyamide, benzocyclobutene, acryl, or epoxy; a siloxane material; or the like and is formed by a CVD method, a sputtering method, an SOG method, a droplet discharge method, a screen printing method, or the like. For example, the insulating film 113 can have a stacked-layer structure including two layers of a silicon nitride oxide film and a silicon oxynitride film. Note that a siloxane material is a material having a Si—O—Si bond. Siloxane has a skeleton structure including a bond of silicon (Si) and oxygen (O). Siloxane includes an organic group containing at least hydrogen (such as an alkyl group or aromatic hydrocarbon) as a substituent. Alternatively, siloxane may include a fluoro group as a substituent. Further alternatively, siloxane may include both an organic group containing at least hydrogen and a fluoro group as a substituent.

Note that before or after forming the insulating film 113, thermal treatment may be performed for recovering crystallinity of the semiconductor film, activating an impurity element which is added to the semiconductor film, or hydrogenating the semiconductor film. The thermal treatment can employ a thermal anneal or laser anneal method, an RTA method, or the like.

Figure 2D:
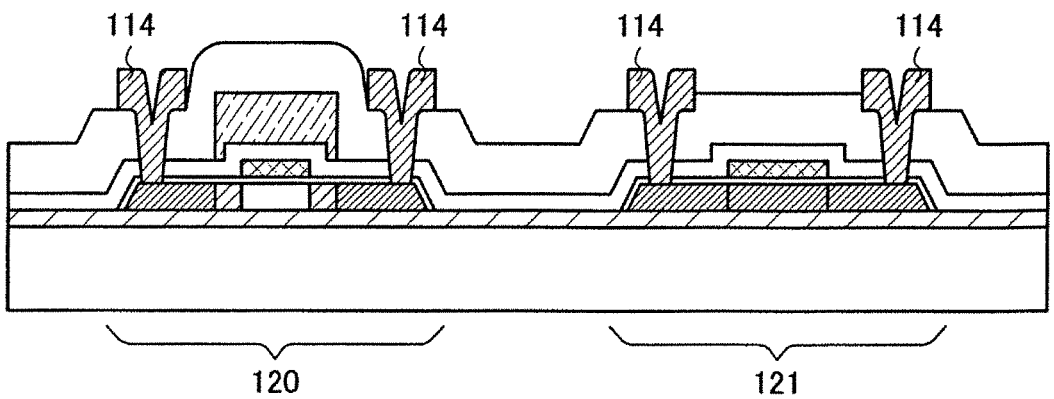
Figure 4A:
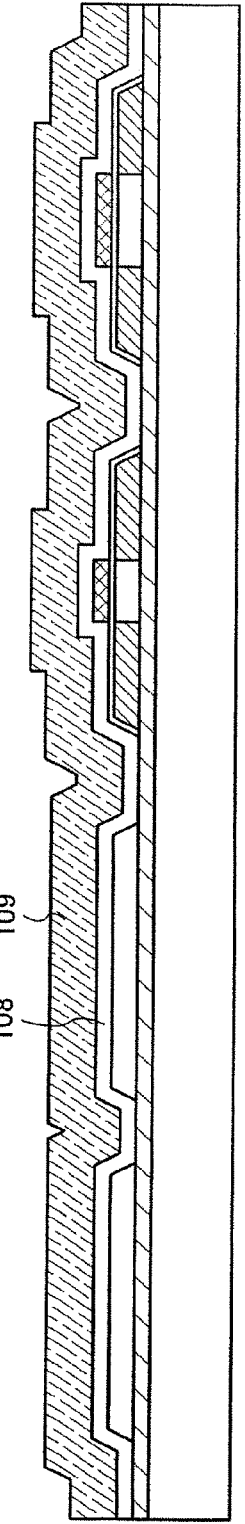
FIGS. 4A to 4C are diagrams showing an example of a method of manufacturing a semiconductor device of the present invention.
Figure 4B:
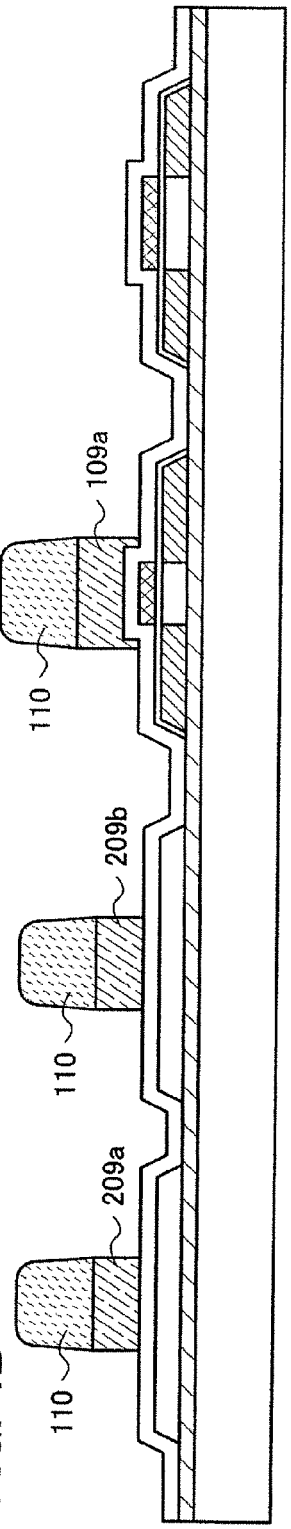
Figure 4C:
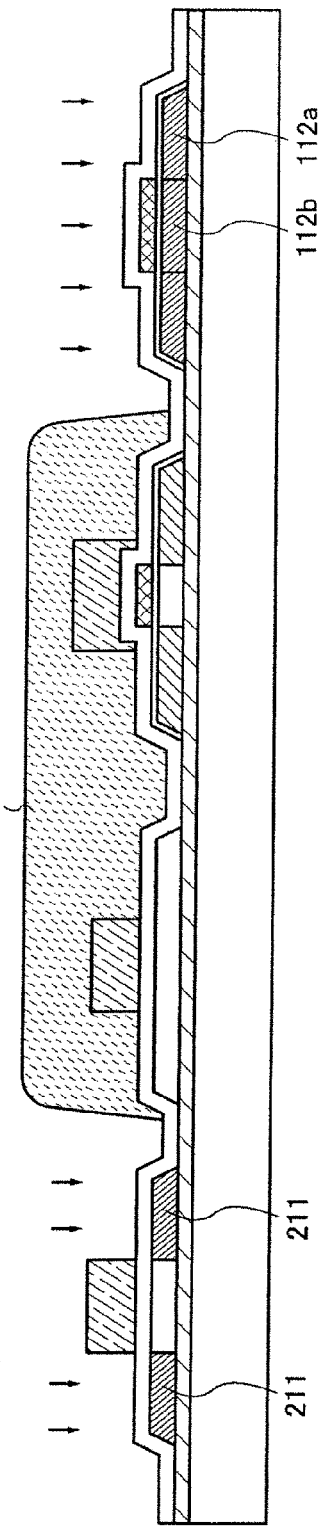
Figure 5A:
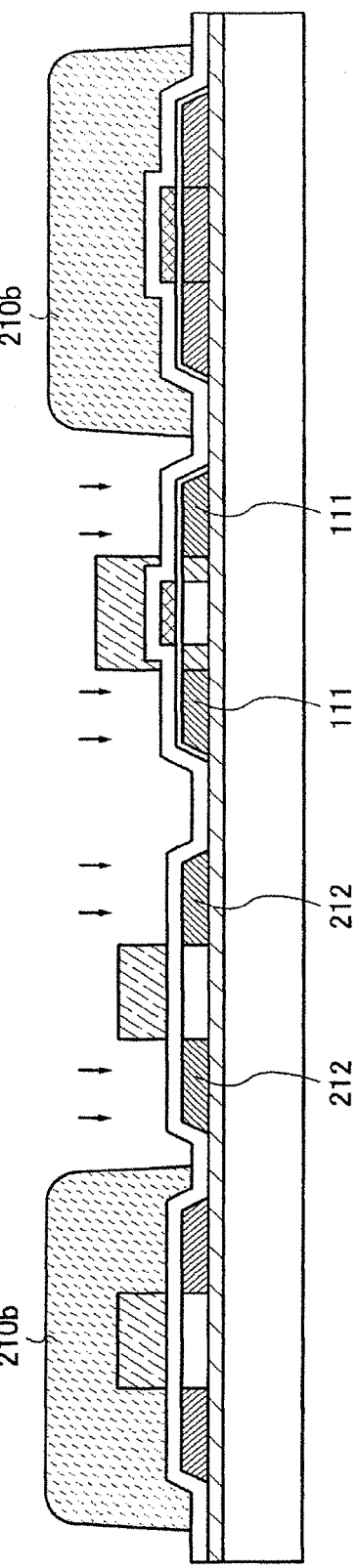
FIGS. 5A and 5B are diagrams showing an example of a method of manufacturing a semiconductor device of the present invention.
Figure 5B:
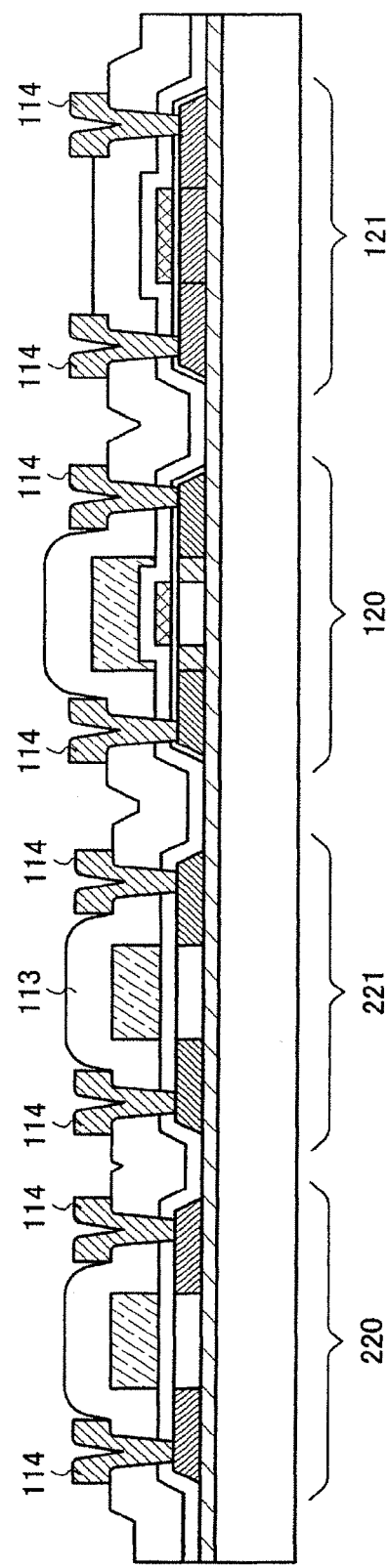

Then, conductive films 114 which are electrically connected to the impurity regions 111a in the crystalline semiconductor film 103a and the impurity regions 112a in the crystalline semiconductor film 103b are formed (see FIG. 2D). Here, opening portions are formed in the insulating films 104a, 104b, 108, and 113 to expose parts of the impurity regions 111a in the crystalline semiconductor film 103a and the impurity regions 112a in the crystalline semiconductor film 103b. The conductive films 114 are formed in the opening portions.

The conductive film 114 is a single layer or stacked-layers which includes an element selected from aluminium (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si); or an alloy material or a compound material which contains such an element as its main component; and is formed by a CVD method, a sputtering method, or the like. An alloy material containing aluminium as its main component refers to, for example, a material containing aluminum as its main component which also contains nickel, and an alloy material containing aluminum as its main component which also contains nickel and either or both of carbon and silicon. The conductive films 114 preferably have, for example, a stacked-layer structure including a barrier film, an aluminum-silicon (Al—Si) film, and a barrier film, or a stacked-layer structure including a barrier film, an aluminum-silicon (Al—Si) film, a titanium nitride film, and a barrier film. Note that a barrier film refers to a thin film including titanium, nitride of titanium, molybdenum, or nitride of molybdenum. Aluminum and aluminum silicon, which have low resistance values and are inexpensive, are the optimal materials for forming the conductive films 114. When barrier layers are provided as an upper layer and a lower layer, generation of hillocks of aluminum or aluminum silicon can be prevented. Further, when a barrier film contains titanium which is an element having a high reducing property, even if there is a thin natural oxide film formed on the crystalline semiconductor film, the natural oxide film can be reduced, and a favorable contact between the conductive film 114 and the crystalline semiconductor film can be obtained.

As the foregoing process, a semiconductor device including the memory element 120 and the capacitor 121 can be obtained.

In the semiconductor device described in this embodiment mode, the memory element 120 includes the insulating film 104a, which can serve as a tunnel insulating film 104a, the conductive film 105a, which can serve as a floating gate, the insulating film 108, which can serve as an interlayer film between the conductive film 105a and the conductive film 109a, and the conductive film 109a, which can serve as a gate electrode.

The capacitor 121 has a structure in which the insulating film 104b is provided between the crystalline semiconductor film 103b and the conductive film 105b which can serve as electrodes. The conductive film 105b is formed of the same material as the conductive film 105a, which can serve as a floating gate of the memory element 120, and the insulating film 104b is formed of the same material as the insulating film 104a, which can serve as a tunnel insulating film of the memory element 120. The insulating film 104b of the capacitor 121 is formed of the same material as the insulating film 104a, which can serve as a tunnel insulating film of the memory element 120, so that the thickness of the insulating film included in the capacitor can be small; thus the area of the capacitor can be reduced.

When the memory element 120 and the capacitor 121 are formed in the same process as described above, simplification in manufacturing process can be achieved and cost reduction can be realized. In particular, since the semiconductor film which serves as one electrode of the capacitor 121 is doped with an impurity element through the conductive film 105*b* in this embodiment mode, a step of doping only the crystalline semiconductor film 103*b* with an impurity element selectively before forming the conductive film 105*b* can be omitted; therefore, the manufacturing process can be simplified.

Note that while an example in which a thin film transistor (TFT)-type memory element or a capacitor is used as a memory element in this embodiment mode, the present invention is not limited thereto. For example, a structure may be employed in which a semiconductor film which is formed using an SOI substrate is used as an electrode of a memory element.

This embodiment mode can be implemented by being combined with a structure of a semiconductor device or a method of manufacturing a semiconductor device which is described in another embodiment mode in this specification.

Embodiment Mode 2

In this embodiment mode, a method of manufacturing a semiconductor device which is different from the method described in the foregoing embodiment mode and a structure of a semiconductor device obtained by the method are described with reference to the drawings. In specific, a method of manufacturing a memory element, a capacitor, and a transistor in the same process, and a structure of a semiconductor device obtained by the method are described with reference to the drawings.

A method of manufacturing a semiconductor device in this embodiment mode is described with reference to FIGS. 3A to 5B.

First, the crystalline semiconductor films 103*a*, 103*b*, 203*a*, and 203*b*, which are island-shaped and formed over one surface of the substrate 101 with insulating film 102 interposed therebetween (see FIG. 3A). Note that a memory element which is formed later has the crystalline semiconductor film 103*a*, a capacitor which is formed later has the crystalline semiconductor film 103*b*, and a thin film transistor which is formed later has the crystalline semiconductor films 203*a* and 203*b*.

Then, the insulating films 104*a*, 104*b*, 204*a*, and 204*b* are formed to cover the crystalline semiconductor films 103*a*, 103*b*, 203*a*, and 203*b*, respectively. Then, the conductive film 105 is formed to cover the insulating films 104*a*, 104*b*, 204*a*, and 204*b* (see FIG. 3B).

Further, the crystalline semiconductor films 103*a*, 203*a*, and 203*b* may be doped with an impurity element at low concentration in advance, in order to control a threshold value or the like. In this case, regions which serve as channel formation regions in the crystalline semiconductor films 103*a*, 203*a*, and 203*b* later is also doped with the impurity element. The impurity element can be either an impurity element imparting n-type conductivity or an impurity element imparting p-type conductivity. As an impurity element imparting n-type conductivity, phosphorus (P), arsenic (As), or the like can be used. As an impurity element imparting p-type conductivity, boron (B), aluminium (Al), gallium (Ga), or the like can be used. Here, the entire part of the crystalline semiconductor films 103*a*, 203*a*, and 203*b* is doped with boron (B) as the impurity element in advance to contain boron (B) at a concentration of $5 \times 10^{15}$ to $5 \times 10^{17}/\text{cm}^3$.

Then, after removing a selected portion of the conductive film 105 which is formed above the crystalline semiconductor films 203*a* and 203*b*, the insulating film 204*a* and the insulating film 204*b* are removed (see FIG. 3C). Note that the conductive film 105 is left above the crystalline semiconductor films 103*a* and 103*b*.

Then, the resists 106 are formed selectively over the conductive film 105 which is left and to cover the crystalline semiconductor films 203*a* and 203*b*. After that, the conductive film 105 which is left is further etched selectively with the resists 106 serving as a mask so that the conductive films 105*a* and 105*b* are left over the crystalline semiconductor film 103*a* and 103*b*, respectively. Then, the crystalline semiconductor films 103*a* and 103*b* are doped with an impurity element with the resist 106 serving as a mask to form the impurity regions 107 in the crystalline semiconductor films 103*a* and 103*b* (see FIG. 3D).

An impurity element which is used for the doping is either an n-type impurity element or a p-type impurity element. As an n-type impurity element, phosphorus (P), arsenic (As), or the like can be used. As a p-type impurity element, boron (B), aluminium (Al), gallium (Ga), or the like can be used. Here, the case where the crystalline semiconductor films 103*a* and 103*b* are doped with phosphorus (P) to form the impurity regions 107 is described.

Next, the resist 106 is removed, and then the insulating film 108 is formed to cover the crystalline semiconductor films 203*a* and 203*b*, and the conductive films 105*a* and 105*b*. After that, the conductive film 109 is formed over the insulating film 108 (see FIG. 4A).

Then, the resist 110 is formed selectively over the conductive film 109. The conductive film 109 is selectively etched with the resist 110 serving as a mask to leave conductive films 109*a*, 209*a*, and 209*b* over the crystalline semiconductor films 103*a*, 203*a*, and 203*b*, respectively (see FIG. 4A). The conductive film 109 formed over the crystalline semiconductor film 103*b* is removed.

Then, after the resist 110 is removed, a resist 210*a* is formed to cover the crystalline semiconductor films 103*a* and 203*b*. The crystalline semiconductor films 203*a* and 103*b* is doped with an impurity element with the resist 210*a* and the conductive film 209*a* serving as a mask (see FIG. 4C). A region of the crystalline semiconductor film 203*a* which does not overlap with the conductive film 209*a* is doped with the impurity element to form impurity regions 211. The entire part of the crystalline semiconductor film 103*b* is doped with an impurity element through the conductive film 105*b* to form impurity regions 112*a* and an impurity region 112*b* which overlaps with the conductive film 105*b*.

An impurity element which is used for the doping is either an n-type impurity element or a p-type impurity element. Here, the case is described where the crystalline semiconductor films 203*a* and 103*b* is doped with boron (B), which is a light element and is a p-type impurity element, at high concentration to form p-type impurity regions 211, 112*a*, and 112*b*. When the crystalline semiconductor film 103*b* is doped with an impurity element through the insulating film 108, the conductive film 105, and the insulating film 104*b*, the damage of the insulating film 104*b* can be reduced by using a light element like boron (B) as the impurity element.

Then, after the resist 210*a* is removed, a resist 210*b* is formed to cover the crystalline semiconductor films 103*b* and 203*a*. The crystalline semiconductor films 103*a* and 203*b* are doped with an impurity element with the resist 210*b* and conductive films 109 and 209*b* serving as a mask (see FIG. 5A). A region of the crystalline semiconductor film 103*a* which is not overlapped with the conductive film 109*a* is doped with the impurity element to form impurity regions 111. A region of the crystalline semiconductor film 203*b* which does not overlap with the conductive film 209*b* is doped with the impurity element to form impurity regions 212. Note that doping with an impurity element to the crystalline semiconductor film 103b is not necessarily performed at the step illustrated in FIG. 4C. The doping may be performed at the step illustrated in FIG. 5A and at the same time as doping the crystalline semiconductor films 103b and 203a with an impurity element. Accordingly, a concentration of an impurity element which is contained in a region of the crystalline semiconductor film 103b which is under the conductive film 105b is higher than a concentration of an impurity element which is contained in a region of the crystalline semiconductor film 103a which is under the conductive film 105a, higher than a concentration of an impurity element which is contained in a region of the crystalline semiconductor film 203a which is under the conductive film 209a, and higher than a concentration of an impurity element which is contained in a region of the crystalline semiconductor film 203b which is under the conductive film 209b.

An impurity element which is used for the doping is either an n-type impurity element or a p-type impurity element. Here, the case where the crystalline semiconductor films 103a and 203b are doped with phosphorus (P) at high concentration to form the n-type impurity regions 111 and 212 is described.

Then, the insulating film 113 is formed to cover the conductive films 109a, 209a, and 209b and the insulating film 108. After that, conductive films 114 which are electrically connected to the impurity regions 111 in the crystalline semiconductor film 103a, the impurity regions 112a in the crystalline semiconductor film 103b, the impurity regions 211 in the crystalline semiconductor film 203a, and the impurity regions 212 in the crystalline semiconductor film 203b are formed (see FIG. 5B).

By the foregoing process, a semiconductor device including the memory element 120, the capacitor 121, and the thin film transistors 220 and 221 can be obtained.

Note that while this embodiment mode describes an example in which a thin film transistor is used as a transistor, a type of a transistor is not limited thereto and various types of transistors can be employed. That is, there is no limitation on types of transistor which can be used. Accordingly, a transistors which can be employed is not limited to a thin film transistor (TFT) using a non-single crystal semiconductor film typified by amorphous silicon or polycrystal silicon, and a transistor formed using a semiconductor substrate or an SOI substrate, a MOS transistor, a junction transistor, a bipolar transistor, a transistor using a compound semiconductor such as ZnO or a-InGaZnO, a transistor using an organic semiconductor or carbon nanotube, or the like can be used. Note that a non-single crystal semiconductor film may contain hydrogen or halogen.

In addition, a transistor can have various structures without limitation to a certain structure. For example, a multigate structure which has two or more gates may be employed. With a multi-gate structure, off-current can be reduced and withstand voltage of the transistor can be increased so as to improve the reliability, and drain-source current does not greatly changes even when drain-source voltage changes in a saturation region so that flat characteristics can be realized. Further, an LDD region may be provided. With an LDD region, off-current can be reduced and withstand voltage of the transistor can be increased so as to improve the reliability, and drain-source current does not greatly change even when drain-source voltage changes in a saturation region so that flat characteristics can be realized.

This embodiment mode can be implemented by being combined with a structure of a semiconductor device or a method of manufacturing a semiconductor device which is described in another embodiment mode in this specification.

Embodiment Mode 3

In this embodiment mode, an example of an application of a semiconductor device described in the foregoing embodiment modes is described. Specifically, examples of an application of the semiconductor device which can input and output data without contact is described with reference to the drawings. A semiconductor device which can input and output data without contact is also referred to as an RFID tag, an ID tag, an IC tag, an IC chip, an RF tag, a wireless tag, an electronic tag, or a wireless chip depending on the usage mode.

Figure 11A:
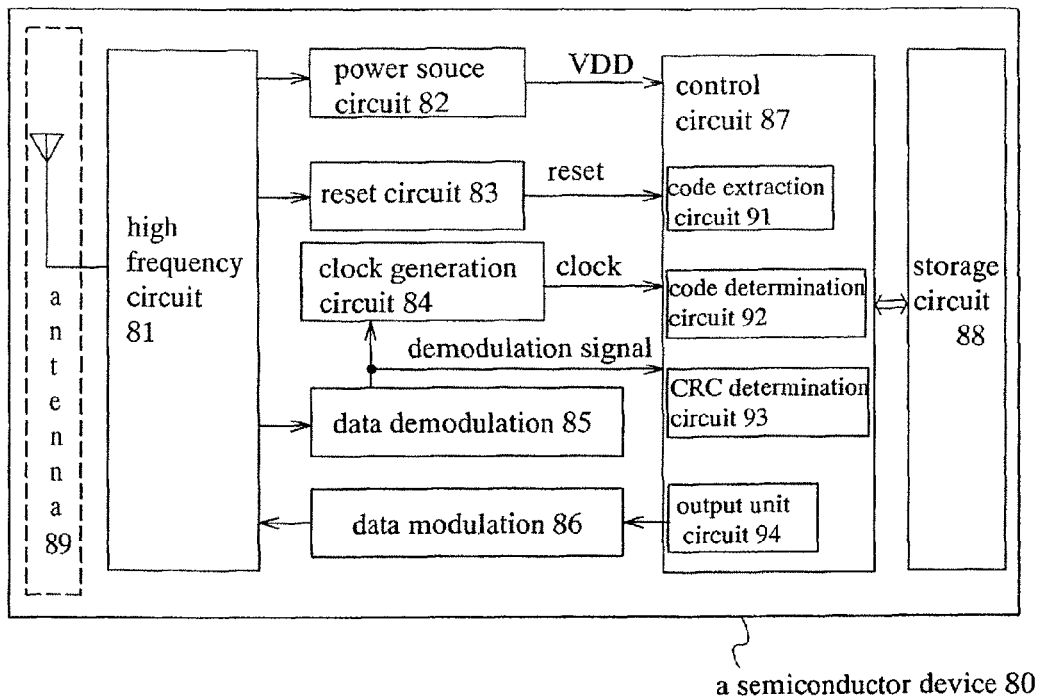
FIGS. 11A to 11C are diagrams showing an example of usage of a semiconductor device of the present invention.

A semiconductor device 80 has a function of communicating data without contact, and includes a high frequency circuit 81, a power source circuit 82, a reset circuit 83, a clock generation circuit 84, a data demodulation circuit 85, a data modulation circuit 86, a control circuit 87 which controls another circuit, a storage circuit 88, and an antenna 89 (see FIG. 11A). The high frequency circuit 81 is a circuit which receives a signal from the antenna 89, and receives a signal from the data modulation circuit 86 and outputs the signal through the antenna 89. The power source circuit 82 is a circuit which generates a power source potential from the received signal. The reset circuit 83 is a circuit which generates a reset signal. The clock generation circuit 84 is a circuit which generates various clock signals based on the received signal inputted from the antenna 89. The data demodulation circuit 85 is a circuit which demodulates the received signal and outputs the signal to the control circuit 87. The data modulation circuit 86 is a circuit which modulates the signal received from the control circuit 87. In the control circuit 87, a code extraction circuit 91, a code determination circuit 92, a CRC determination circuit 93, and an output unit circuit 94 are included, for example. Note that the code extraction circuit 91 is a circuit which separately extracts a plurality of codes included in an instruction transmitted to the control circuit 87. The code determination circuit 92 is a circuit which compares the extracted code and a reference code to determine the content of the instruction. The CRC circuit is a circuit which detects the presence or absence of a transmission error or the like based on the determined code.

Next, an example of operation of the foregoing semiconductor device is described. First, a radio signal is received by the antenna 89. The radio signal is transmitted to the power source circuit 82 via the high frequency circuit 81, and a high power source potential (hereinafter referred to as VDD) is generated. The VDD is supplied to each circuit included in the semiconductor device 80. In addition, a signal transmitted to the data demodulation circuit 85 via the high frequency circuit 81 is demodulated (hereinafter, such a signal is referred to as a demodulated signal). Further, the demodulated signal and a signal which has passed the high frequency circuit 81 and the reset circuit 83 or the clock generation circuit 84 are transmitted to the control circuit 87. The signal transmitted to the control circuit 87 is analyzed by the code extraction circuit 91, the code determination circuit 92, the CRC determination circuit 93, and the like. Then, in accordance with the analyzed signal, information of the semiconductor device which is stored in the storage circuit 88 is outputted. The outputted information of the semiconductor device is encoded by passing through the output unit circuit 94. Furthermore, the encoded information of the semiconductor device 80 is passed through the data modulation circuit 86 and transmitted by the antenna 89 as a radio signal. Note that a low power source potential (hereinafter, referred to as VSS) is common among a plurality of circuits included in the semiconductor device 80, and VSS can be GND.

In this manner, a signal is transmitted from the reader/writer to the semiconductor device 80 and a signal transmitted from the semiconductor device 80 is received by the reader/writer, thus, the data of the semiconductor device can be read.

The semiconductor device 80 may be either a type where no power supply (battery) is built-in but electromagnetic waves are used to supply a power supply voltage to each circuit, or a type where both electromagnetic waves and a power supply (battery) are used to generate a power supply voltage for each circuit.

By applying a manufacturing method described in any of the foregoing embodiment modes to the high frequency circuit 81, the power source circuit 82, the reset circuit 83, the clock generation circuit 84, the data demodulation circuit 85, the data modulation circuit 86, the control circuit 87, and the storage circuit 88, a semiconductor device can be obtained at low cost.

Figure 11B:
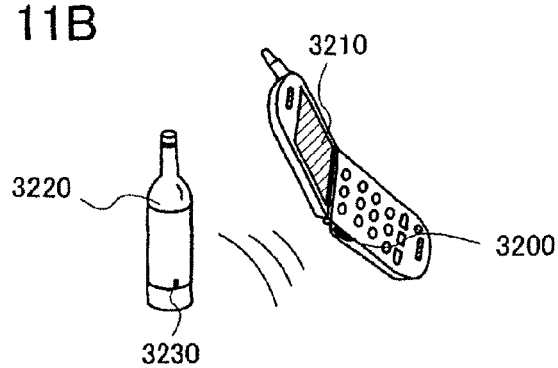
Figure 11C:
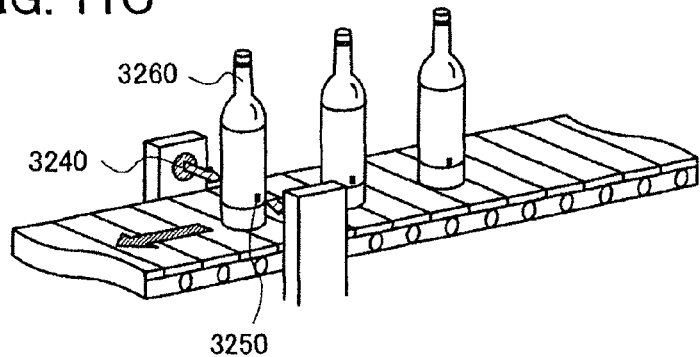
Figure 12A:
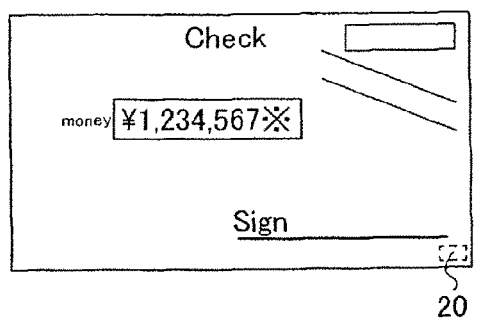
FIGS. 12A to 12H are diagrams showing an example of usage of a semiconductor device of the present invention.
Figure 12B:
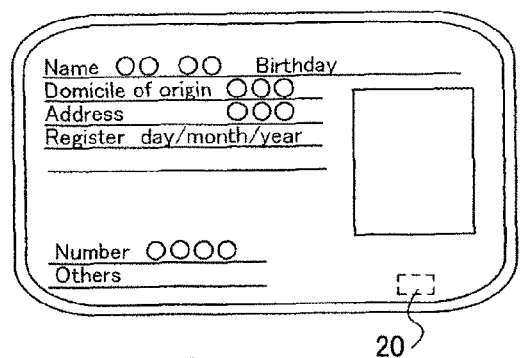
Figure 12C:
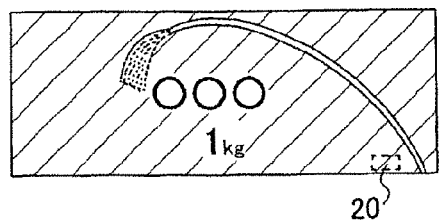
Figure 12D:
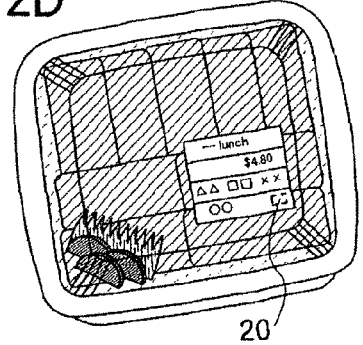
Figure 12E:
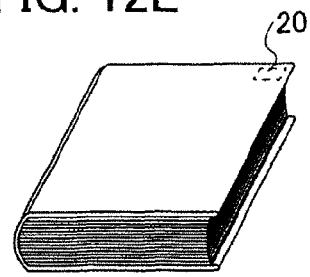
Figure 12F:
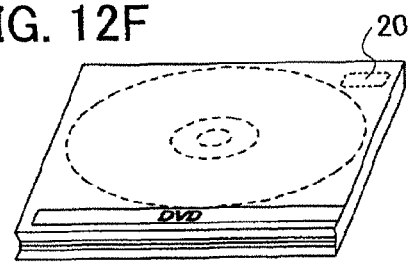
Figure 12G:
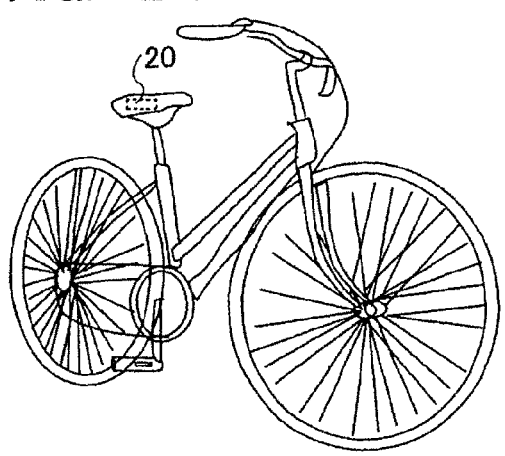
Figure 12H:
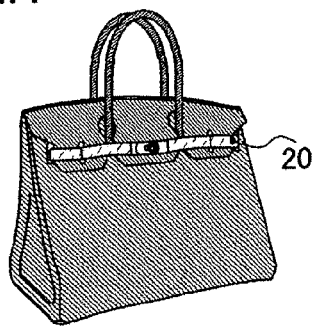

Next, an example of a usage mode of a semiconductor device which can input and output data without contact is described. A reader/writer 3200 is attached to a side face of a portable terminal including a display portion 3210, and a semiconductor device 3230 is attached to a side face of an article 3220 (see FIG. 11B). When the reader/writer 3200 is put close to the semiconductor device 3230 included in the article 3220, information of the article 3220, such as a raw material, the place of origin, an inspection result in each production process, the history of distribution, or an explanation of the article, is displayed on the display portion 3210. Furthermore, the product 3260 can be inspected while when a product 3260 is transported by a conveyor belt, using a reader/writer 3240 and a semiconductor device 3250 attached to the product 3260 (see FIG. 11C). Thus, by utilizing the semiconductor devices for systems, information can be acquired easily, and a higher function and higher added value can be realized.

As a signal transmission method in the foregoing semiconductor device which can input and output data without contact, an electromagnetic coupling method, an electromagnetic induction method, a microwave method, or the like can be used. A transmission method may be appropriately selected by a practitioner in consideration of an intended use, and an optimum antenna may be provided in accordance with the transmission method.

In the case of employing, for example, an electromagnetic coupling method or an electromagnetic induction method (e.g., a 13.56 MHz band) as a signal transmission method of the semiconductor device, electromagnetic induction caused by a change in magnetic field density is used. Therefore, the conductive film serving as an antenna is formed into an annular shape (e.g., a loop antenna) or a spiral shape (e.g., a spiral antenna).

In the case of employing, for example, a microwave method (for example, an UHF band (860 to 960 MHz band), a 2.45 GHz band, or the like) as a signal transmission method of the semiconductor device, the shape such as the length of the conductive film serving as an antenna may be appropriately set in consideration of a wavelength of an electromagnetic wave which is used for signal transmission. For example, the conductive film serving as an antenna can be formed into a linear shape (e.g., a dipole antenna), a flat shape (e.g., a patch antenna), or a ribbon-like shape. In addition, the shape of the conductive film serving as an antenna is not limited to a linear shape, and the conductive film serving as an antenna may be formed in a curved-line shape, a meander shape, or a combination thereof, in consideration of a wavelength of an electromagnetic wave.

The conductive film serving as an antenna is formed of a conductive material by a CVD method, a sputtering method, a printing method such as screen printing or gravure printing, a droplet discharge method, a dispenser method, a plating method, or the like. The conductive film is formed to have a single-layer structure or a stacked-layer structure which includes an element selected from aluminum (Al), titanium (Ti), silver (Ag), copper (Cu), gold (Au), platinum (Pt), nickel (Ni), palladium (Pd), tantalum (Ta), and molybdenum (Mo) or an alloy material or a compound material containing such an element as its main component.

For example, in the case of forming a conductive film serving as an antenna by using a screen printing method, the conductive film can be formed by selectively printing a conductive paste in which conductive particles each having a grain size of several nanometers to several tens of micrometers are dissolved or dispersed in an organic resin. As the conductive particle, a fine particle or a dispersive nanoparticle of one or more metals of silver (Ag), gold (Au), copper (Cu), nickel (Ni), platinum (Pt), palladium (Pd), tantalum (Ta), molybdenum (Mo), and titanium (Ti) or silver halide can be used. As the organic resin contained in the conductive paste, one or a plurality of organic resins serving as a binder, a solvent, a dispersant, or a coating for the metal particle can be used. Typically, an organic resin such as an epoxy resin or a silicone resin can be used. In formation of the conductive film, baking is preferably performed after the conductive paste is applied. For example, in the case of using fine particles (of which grain size is 1 nm to 100 nm inclusive) containing silver as its main component as a material of the conductive paste, a conductive film can be obtained by hardening the conductive paste by baking it at a temperature of 150 to 300° C. Alternatively, fine particles containing solder or lead-free solder as its main component may be used; in this case, it is preferable to use a fine particle having a grain size of 20 μm or less. Solder or lead-free solder has an advantage of being low cost.

Note that an applicable range of a flexible semiconductor device is wide in addition to the foregoing examples, and the flexible semiconductor device can be applied to any product as long as it clarifies information such as the history of an object without contact and utilizes the information for production, management, or the like. For example, the semiconductor device can be mounted on bills, coins, securities, certificates, bearer bonds, packing containers, books, recording media, personal belongings, vehicles, food, clothing, health products, commodities, medicine, electronic appliances, and the like. Examples of them are described with reference to FIGS. 12A to 12H.

Bills and coins are money distributed to the market, and include one valid in a certain area (cash voucher), memorial coins, and the like. Securities refer to checks, certificates, promissory notes, and the like (see FIG. 12A). Certificates refer to driver's licenses, certificates of residence, and the like (see FIG. 12B). Bearer bonds refer to stamps, rice coupons, various gift certificates, and the like (see FIG. 12C). Packing containers refer to wrapping paper for food containers, plastic bottles, and the like (see FIG. 12D). Books refer to hardbacks, paperbacks, and the like (see FIG. 12E). Recording media refer to DVD software, video tapes, and the like (see FIG. 12F). Vehicles refer to wheeled vehicles like bicycles, ships, and the like (see FIG. 12G). Personal belongings refer to bags, glasses, and the like (see FIG. 12H). Food refers to food articles, drink, and the like. Clothing refers to clothes, footwear, and the like. Health products refer to medical instruments, health instruments, and the like. Commodities refer to furniture, lighting equipment, and the like. Medicine refers to medical products, pesticides, and the like. Electronic appliances refer to liquid crystal display devices, EL display devices, television sets (TV receivers and flat-screen TV receivers), cellular phones, and the like.

Forgery can be prevented by mounting the semiconductor device 80 on bills, coins, securities, certificates, bearer bonds, and the like. The efficiency of an inspection system, a system used in a rental shop, and the like can be improved by mounting the semiconductor device 80 on packing containers, books, recording media, personal belongings, food, commodities, electronic appliances, and the like. Forgery or theft can be prevented by mounting the semiconductor device 80 on vehicles, health products, medicine, or the like; and wrong use of the medicines can be prevented. The semiconductor device 80 may be provided by, for example, being attached to the surface of an object or embedded in an object. For example, the semiconductor device 80 may be embedded in paper of a book or embedded in an organic resin of a package when the package is made of an organic resin. When the semiconductor device is provided on paper or the like, damage on the elements included in the semiconductor device can be prevented by providing the semiconductor device which has a structure described in the foregoing embodiment modes.

In this manner, when the semiconductor device is provided for packaging containers, storage media, personal belongings, foods, clothing, daily commodities, electronic appliances, and the like, the efficiency of an inspection system, a rental shop system, and the like can be improved. In addition, when the semiconductor device is provided for vehicles, forgery and theft thereof can be prevented. Further, when the semiconductor device is implanted in creatures such as animals, identification of the individual creature can be easily carried out. For example, when the semiconductor device is implanted in creatures such as domestic animals, not only the year of birth, sex, breed, and the like but also health conditions such as body temperature can be easily managed.

Note that this embodiment mode can be implemented by being combined with a structure of a semiconductor device or a method of manufacturing the semiconductor device which is described in another embodiment mode in this specification. That is, any of the structures of the semiconductor devices, which are described in the foregoing embodiment modes, can be applied to the semiconductor device described in this embodiment mode.

Embodiment Mode 4

In this embodiment mode, a method of manufacturing the semiconductor device described in Embodiment Mode 3 which can input and output data without contact is described with reference to the drawings. Note that this embodiment mode describes a case where a semiconductor device is manufactured through a step of transferring an element such as a thin film transistor which is formed over a supporting substrate (a temporary substrate) into a flexible substrate. In addition, this embodiment mode describes a case where a plurality of chips each including an integrated circuit portion are provided over one substrate (a supporting substrate) (here, 4 chips in length×3 chips in width) to manufacture a plurality of semiconductor devices. In the following description, FIGS. 6A to 7B are schematic top views and FIGS. 8A to 9B are schematic cross-sectional views taken along line $A_2$-$B_2$ in FIGS. 6A to 7B.

Figure 6A:
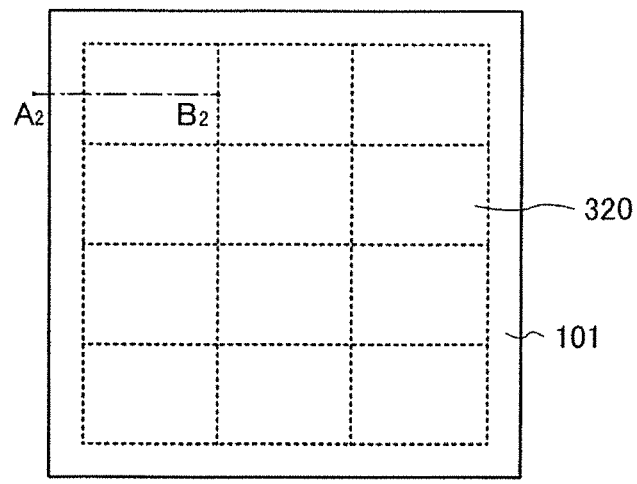
FIGS. 6A to 6C are diagrams showing an example of a method of manufacturing a semiconductor device of the present invention.

First, a separation layer 301 is formed over one surface of the substrate 101, and then the semiconductor films 103a, 103b, 203a, and 203b which are island-shaped are formed with an insulating film 102 serving as a base interposed between the separation layer 301 and the semiconductor films which are island-shaped (see FIGS. 6A and 8A). Note that in the following steps described below, an integrated circuit and an antenna included in a semiconductor device are formed in each of regions 320 in FIG. 6A.

Note that, while the separation layer 301 is formed over the entire surface of the substrate 101 in this step, it is also allowed, if needed, that the separation layer 301 is formed over the entire surface of the substrate 101, and then processed by a photolithography method to be provided selectively over the substrate 101. In addition, although the separation layer 301 is formed to be in contact with the substrate 101, an insulting film such as a silicon oxide film, a silicon oxynitride film, a silicon nitride film, or a silicon nitride oxide film may be formed to be in contact with the substrate 101, if needed, and then the separation layer 301 may be formed to be in contact with the insulating film.

The separation layer 301 can be a metal film or stacked-layers which includes a metal film and a metal oxide film. As a metal film, a single layer or stacked layers are formed using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material containing such an element as a main component. The metal film can be formed by a sputtering method, any CVD method like a plasma CVD method, or the like. A stacked-layer structure including a metal film and a metal oxide film can be obtained by forming the metal film and then applying plasma treatment or thermal treatment thereon under an oxygen atmosphere or an $N_2O$ atmosphere so that oxide or oxynitride of the metal film can be formed on a surface of the metal film. Alternatively, after the metal film is formed, a surface of the metal film may be processed with a solution which is a strong oxidation agent such as ozone water so that oxide or oxynitride of the metal film can be formed on a surface of the metal film.

Figure 6B:
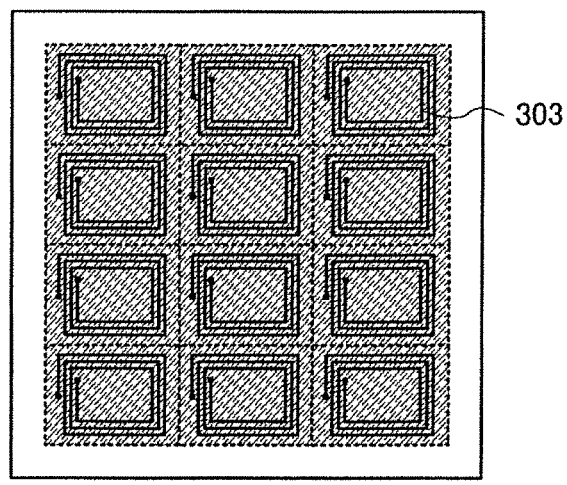

Then, after steps similar to the steps in FIGS. 3B to 5B, which are described in the foregoing embodiment modes are performed, an insulating film 302 is formed to cover the insulating film 113 and the conductive film 114, and then a conductive film 303 serving as an antenna is formed over the insulating film 302 (see FIGS. 6B and 8B).

The insulating film 302 is formed of an inorganic material such as oxide of silicon or nitride of silicon, an organic material such as polyimide, polyamide, benzocyclobutene, acrylic, epoxy, or siloxane by a sputtering method, a CVD method, a SOG method, a droplet discharge method, or the like.

The conductive film 303 is formed of a conductive material by a CVD method, a sputtering method, a printing method such as screen printing or gravure printing, a droplet discharge method, a dispenser method, a plating method, or the like. The conductive material is an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing such an element as its main component. The conductive film 303 is formed to have a single-layer or stacked-layer structure.

Then, an element formation layer 310 including the thin film transistors 220 and 221, the memory element 120, the capacitor 121, the conductive film 303 serving as an antenna, and the like is separated from the substrate 101.

Figure 6C:
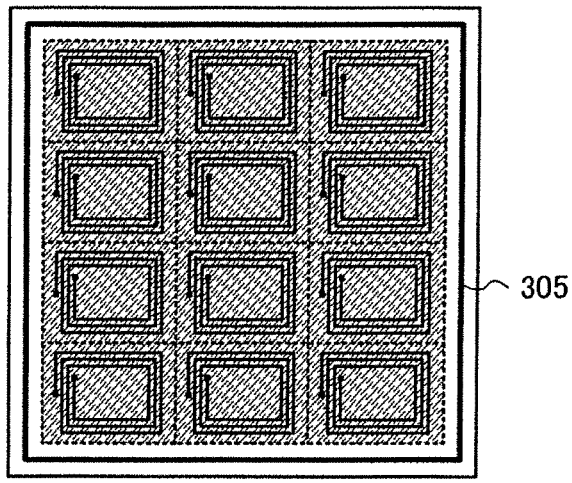

First, an insulating film 304 is formed to cover the conductive film 303, and then laser light irradiation is performed to form an opening portion 305 (see FIGS. 6C and 8C). Then, one surface of the element formation layer 310 (here, a surface of the insulating film 304) is attached to a first sheet material 306. After that, the element formation layer 310 is separated from the substrate 101 (see FIG. 9A). As the first sheet material 306, a plastic film such as a hot-melt film or the like can be used. In the case of separating the first sheet material 306 in a later step, a thermal release tape whose adhesive is reduced when heat is applied thereto can be used as the first sheet material 306.

Note that the surface to be release is wet with an aqueous solution such as water or ozone water during the separation of the element formation layer; therefore, breakage of the elements such as the thin film transistors 220 and 221, the memory element 120, and the capacitor 121 due to static electricity or the like can be prevented. Further, by reusing the substrate 101 from which the element formation layer 310 is separated, the cost can be reduced.

Figure 7A:
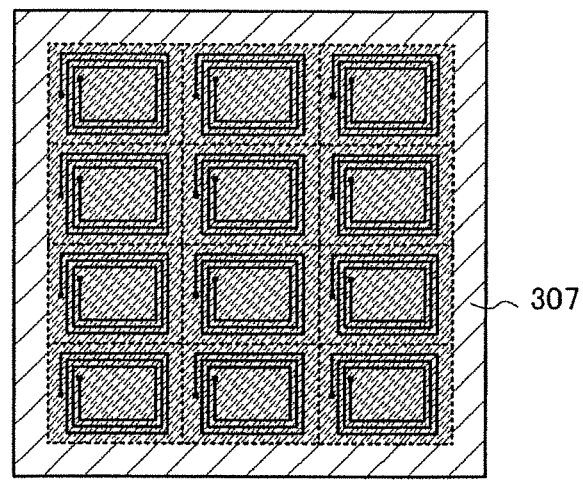
FIGS. 7A and 7B are diagrams showing an example of a method of manufacturing a semiconductor device of the present invention.

Next, the second sheet material 307 is attached to the other surface of the element formation layer 310 (a surface which is exposed by the separation from the substrate 101) (see FIGS. 7A and 9B). A flexible substrate such as a plastic substrate can be used as the second sheet material 307.

Figure 7B:
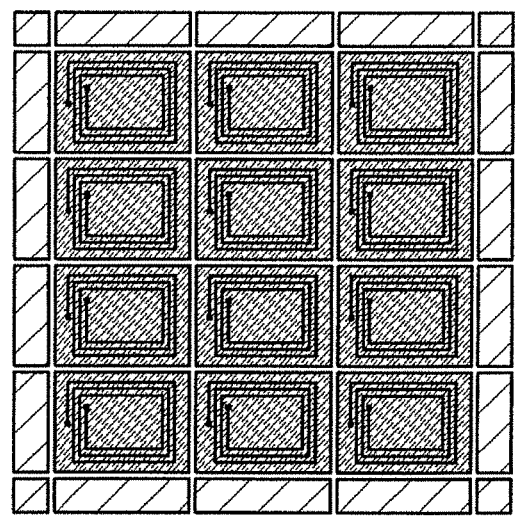
Figure 10:
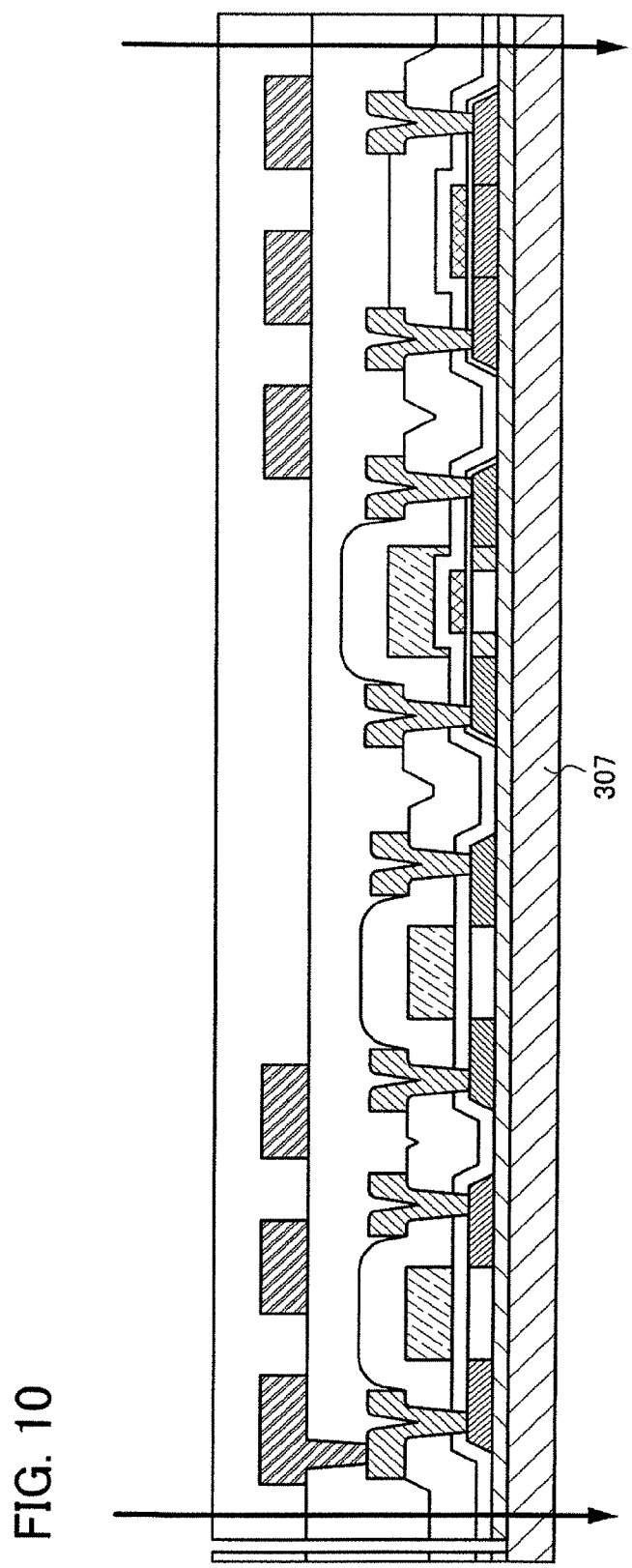
FIG. 10 is a diagram showing a method of manufacturing a semiconductor device of the present invention.

Then, the element formation layer 310 provided with the second sheet material 307 is cut by dicing, scribing, a laser cutting method, or the like and thus a plurality of semiconductor devices can be obtained (see FIGS. 7B and 10). Note that while this embodiment mode describes a case where the first sheet material 306 is separated at the same time or after the second sheet material 307 is attached to the element formation layer 310, the first sheet material 306 may remain.

This embodiment mode describes the case where elements such as a thin film transistor and an antenna are formed over the substrate 101 and then separated from the substrate 101 to manufacture a flexible semiconductor device, but the present invention is not limited to such a case. The flexible semiconductor device can be manufactured over the substrate 101 without the separation layer 301.

Note that while this embodiment mode describes an example in which a thin film transistor is used as a transistor, a type of a transistor is not limited thereto and various types of transistors can be employed. That is, there is no limitation on types of transistors which can be used. Accordingly, a transistors which can be employed is not limited to a thin film transistor (TFT) using a non-single crystal semiconductor film typified by amorphous silicon or polycrystal silicon, and a transistor formed using a semiconductor substrate or an SOI substrate, a MOS transistor, a junction transistor, a bipolar transistor, a transistor using a compound semiconductor such as ZnO or a-InGaZnO, a transistor using an organic semiconductor or carbon nanotube, or the like can be used. Note that a non-single crystal semiconductor film may contain hydrogen or halogen.

In addition, a transistor can have various structures without limitation to a certain structure. For example, a multigate structure which has two or more gates may be employed. With a multi-gate structure, off-current can be reduced and withstand voltage of the transistor can be increased so as to improve the reliability; and drain-source current does not greatly changes even when drain-source voltage changes in a saturation region so that flat characteristics can be realized. Further, an LDD region may be provided. With an LDD region, off-current can be reduced and withstand voltage of the transistor can be increased so as to improve the reliability; and drain-source current does not greatly changes even when drain-source voltage changes in a saturation region so that flat characteristics can be realized.

This application is based on Japanese Patent Application serial no. 2007-046807 filed in Japan Patent Office on Feb. 27, 2007, the entire contents of which are hereby incorporated by reference.

What is claimed is:

1. A semiconductor device comprising:
a substrate;
a first semiconductor film, a second semiconductor film, and a third semiconductor film which are island-shaped and over the substrate;
a first insulating film over the first semiconductor film and the second semiconductor film;
a first conductive film and a second conductive film over the first semiconductor film and the second semiconductor film, respectively, with the first insulating film interposed therebetween;
a second insulating film over the first conductive film, the second conductive film, and the third semiconductor film;
a third conductive film over the first conductive film with the second insulating film interposed therebetween; and
a fourth conductive film over the third semiconductor film with the second insulating film interposed therebetween;
wherein the first semiconductor film, the first insulating film, the first conductive film, the second insulating film, and the third conductive film are stacked to form a nonvolatile memory element;
the second semiconductor film, the first insulating film, and the second conductive film are stacked to form a capacitor;
the third semiconductor film, the second insulating film, and the fourth conductive film are stacked to form a thin film transistor; and
a concentration of an impurity element contained in a region of the second semiconductor film which is under the second conductive film is higher than a concentration of an impurity element contained in a region of the first semiconductor film which is under the first conductive film, and is higher than a concentration of an impurity element in a region of the third semiconductor film which is under the fourth conductive film.

2. A semiconductor device comprising:
a substrate;
a first semiconductor film, a second semiconductor film, and a third semiconductor film which are island-shaped and over the substrate;
a first insulating film over the first semiconductor film and the second semiconductor film;
a first conductive film and a second conductive film over the first semiconductor film and the second semiconductor film, respectively, with the first insulating film interposed therebetween;
a second insulating film over the first conductive film, the second conductive film, and the third semiconductor film;
a third conductive film over the first conductive film with the second insulating film interposed therebetween;
a fourth conductive film over the third semiconductor film with the second insulating film interposed therebetween;

a third insulating film covering the third conductive film, the fourth conductive film, and the second insulating film; and a conductive film serving as an antenna over the third insulating film, wherein the first semiconductor film, the first insulating film, the first conductive film, the second insulating film, and the third conductive film are stacked to form a nonvolatile memory element;

the second semiconductor film, the first insulating film, and the second conductive film are stacked to form a capacitor;

the third semiconductor film, the second insulating film, and the fourth conductive film are stacked to form a thin film transistor; and a concentration of an impurity element contained in a region of the second semiconductor film which is under the second conductive film is higher than a concentration of an impurity element contained in a region of the first semiconductor film which is under the first conductive film, and is higher than a concentration of an impurity element contained in a region of the third semiconductor film which is under the fourth conductive film.

3. The semiconductor device according to claim 1, wherein any one of a glass substrate, a plastic substrate, and an SOI substrate is used as the substrate.

4. The semiconductor device according to claim 2, wherein any one of a glass substrate, a plastic substrate, and an SOI substrate is used as the substrate.

5. The semiconductor device according to claim 1, wherein the semiconductor device is one of an RFID tag, an ID tag, an IC tag, an IC chip, an RF tag, a wireless tag, an electronic tag, and a wireless chip.

6. The semiconductor device according to claim 2, wherein the semiconductor device is one of an RFID tag, an ID tag, an IC tag, an IC chip, an RF tag, a wireless tag, an electronic tag, and a wireless chip.

* * * * *